(12) United States Patent
Shimomura

(10) Patent No.: US 11,094,816 B2
(45) Date of Patent: Aug. 17, 2021

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventor: Saya Shimomura, Komatsu (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 64 days.

(21) Appl. No.: 16/744,252

(22) Filed: Jan. 16, 2020

(65) Prior Publication Data

US 2021/0057573 A1 Feb. 25, 2021

(30) Foreign Application Priority Data

Aug. 20, 2019 (JP) .............................. JP2019-150481

(51) Int. Cl.
*H01L 29/78* (2006.01)
*H01L 29/423* (2006.01)
(Continued)

(52) U.S. Cl.
CPC .. *H01L 29/7813* (2013.01); *H01L 21/823437* (2013.01); *H01L 29/407* (2013.01);
(Continued)

(58) Field of Classification Search
CPC ........... H01L 29/7813; H01L 29/66734; H01L 29/4236; H01L 29/407; H01L 29/42376; H01L 21/823437
See application file for complete search history.

(56) References Cited

U.S. PATENT DOCUMENTS

| 5,196,364 A | 3/1993 | Fazan et al. |
| 6,074,954 A | 6/2000 | Lill et al. |

(Continued)

FOREIGN PATENT DOCUMENTS

| JP | 53-147469 A | 12/1978 |
| JP | 2002-524851 A | 8/2002 |
| JP | 3416161 B2 | 6/2003 |

OTHER PUBLICATIONS

Ueda, D, et al., "A New Vertical Power MOSFET Structure with Extremely Reduced On-Resistance", IEEE Transactions on Electron Devices, vol. ED-32, No. 1, Jan. 1985, pp. 2-6.

(Continued)

*Primary Examiner* — Joseph C. Nicely
(74) *Attorney, Agent, or Firm* — Oblon, McClelland, Maier & Neustadt, L.L.P.

(57) ABSTRACT

A semiconductor device includes a semiconductor part between first and second electrodes, and also includes a control electrode and a field plate between the semiconductor part and the second electrode. The control electrode is positioned between the field plate and the second electrode. The control electrode is electrically isolated from the semiconductor part by a first insulating film including first to third portions and from the second electrode by a second insulating film including fourth and fifth portions. The first portion is provided between the semiconductor part and the field plate electrode. The second portion is provided between the semiconductor part and the control electrode. The third portion is provided between the field plate electrode and the control electrode, and extends into the control electrode. The fourth portion is provided between the second and third portions. The fifth portion is provided between the third portion and the second electrode.

12 Claims, 18 Drawing Sheets

(51) Int. Cl.
H01L 29/40 (2006.01)
H01L 29/66 (2006.01)
H01L 21/8234 (2006.01)

(52) U.S. Cl.
CPC .... H01L 29/4236 (2013.01); H01L 29/42376 (2013.01); H01L 29/66734 (2013.01)

(56) References Cited

U.S. PATENT DOCUMENTS

| | | | |
|---|---|---|---|
| 2017/0222038 A1* | 8/2017 | Katou | H01L 29/42376 |
| 2017/0263767 A1* | 9/2017 | Nishiwaki | H01L 29/66734 |
| 2018/0240867 A1* | 8/2018 | Nitta | H01L 23/53261 |
| 2020/0212219 A1* | 7/2020 | Kim | H01L 29/872 |
| 2020/0273987 A1* | 8/2020 | Zeng | H01L 29/0878 |
| 2020/0295181 A1* | 9/2020 | Shimomura | H01L 29/7813 |

OTHER PUBLICATIONS

Ueda, D, et al., "An Ultra-Low On-Resistance Power MOSFET Fabricated by Using a Fully Self-Aligned Process", IEEE Transactions on Electron Devices, vol. ED-34, No. 4, Apr. 1987, pp. 926-930.

* cited by examiner

SEMICONDUCTOR DEVICE

CROSS-REFERENCE TO RELATED APPLICATIONS

This application is based upon and claims the benefit of priority from Japanese Patent Application No. 2019-150481, filed on Aug. 20, 2019; the entire contents of which are incorporated herein by reference.

FIELD

Embodiments relate to a semiconductor device.

BACKGROUND

There is a semiconductor device having a trench gate structure in which the ON-resistance is reduced and the OFF breakdown voltage is increased by providing a field plate electrode in addition to a gate electrode in the trench. There are cases where the reliability of such a field plate structure decreases due to defects caused by nonuniformity in the manufacturing processes.

DETAILED DESCRIPTION

Figure 1:
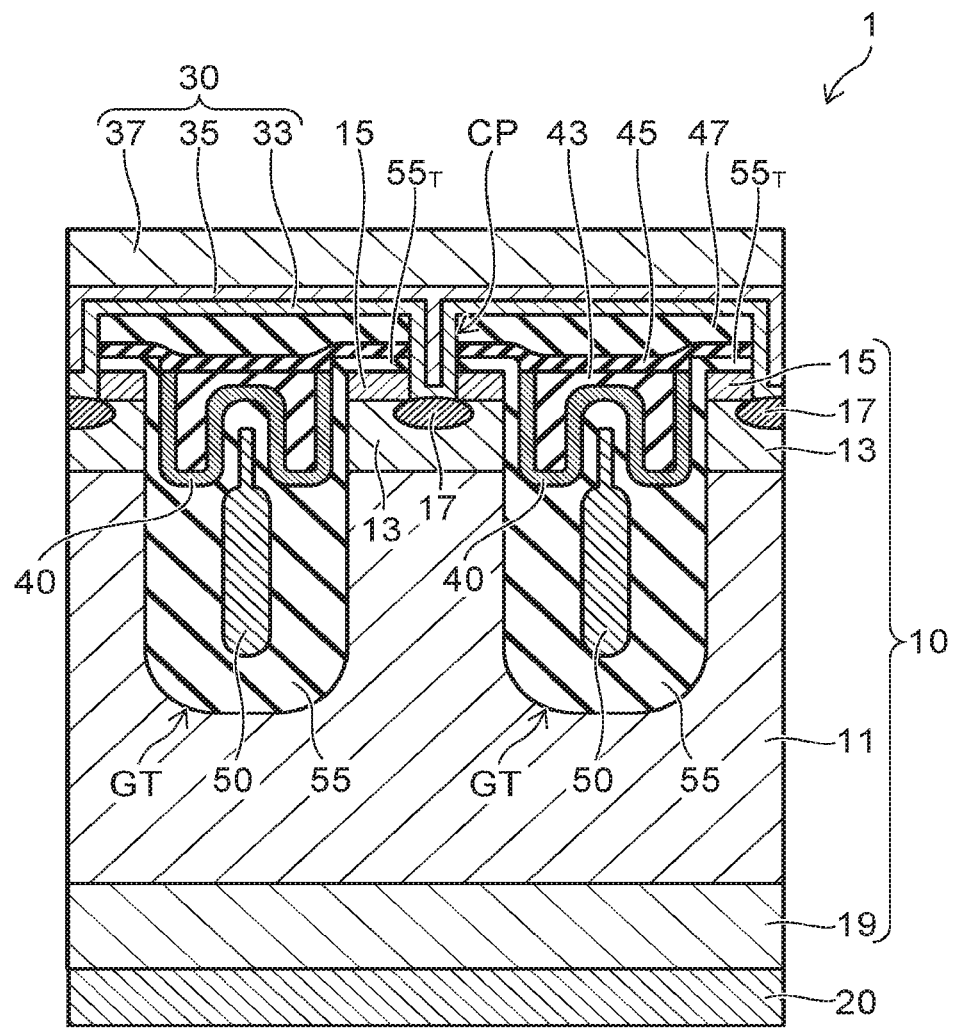
FIG. 1 is a schematic cross-sectional view showing a semiconductor device according to an embodiment.

According to one embodiment, a semiconductor device includes a semiconductor part; a first electrode provided on the semiconductor part; a second electrode, the semiconductor part being provided between the first electrode and the second electrode; a control electrode provided in a trench between the semiconductor part and the second electrode; a field plate electrode provided in the trench, the field plate electrode being positioned between the first electrode and the control electrode; a first insulating film electrically isolating the control electrode and the field plate electrode from the semiconductor part; and a second insulating film electrically isolating the control electrode from the second electrode. The semiconductor part includes a first semiconductor layer of a first conductivity type, a second semiconductor layer of a second conductivity type and a third semiconductor layer of the first conductivity type. The second semiconductor layer is provided between the first semiconductor layer and the second electrode. The third semiconductor layer is selectively provided between the second semiconductor layer and the second electrode. The second semiconductor layer and the third semiconductor layer are electrically connected to the second electrode. The trench has a depth capable of extending into the first semiconductor layer from a surface of the semiconductor part. The control electrode is positioned, in a depth direction of the trench, at a level same as a level of the second semiconductor layer. The field plate electrode is positioned in the first semiconductor layer. The first insulating film includes first to third isolating portions. The first isolating portion is provided between the first semiconductor layer and the field plate electrode. The second isolating portion is provided between the second semiconductor layer and the control electrode. The third isolating portion is provided between the field plate electrode and the control electrode, and extends into the control electrode. The second insulating film includes fourth and fifth isolating portions. The fourth isolating portion extends into the control electrode, and is positioned between the second and third isolating portions. The fifth isolating portion is positioned between the third isolating portion and the second electrode. The control electrode is provided to have a continuous body between the first and second insulating films. The control electrode includes first to third portions. The first portion is positioned between the second isolating portion and the fourth isolating portion. The second portion is positioned between the third isolating portion and the fourth isolating portion. The third portion is positioned between the third isolating portion and the fifth isolating portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. FIG. 1 is a schematic view illustrating a cross section along line A-A shown in FIG. 3. The semiconductor device 1 is, for example, a power MOSFET and has a trench gate structure.

As shown in FIG. 1, the semiconductor device 1 includes a semiconductor part 10, a drain electrode 20 (a first electrode), a source electrode 30 (a second electrode), a gate electrode 40, and a field plate electrode 50. The semiconductor part 10 includes, for example, silicon. The drain electrode 20 is provided on the back surface of the semiconductor part 10. The source electrode 30 is provided at the front surface side of the semiconductor part 10.

The gate electrode 40 and the field plate electrode 50 are provided in a gate trench GT provided at the front surface side of the semiconductor part 10. The gate electrode 40 is positioned between the source electrode 30 and the field plate electrode 50. The field plate electrode 50 is positioned between the drain electrode 20 and the gate electrode 40.

The gate electrode 40 is electrically insulated from the source electrode 30 by an insulating film 43, an insulating film 45, and an insulating film 47. Also, the field plate electrode 50 is electrically insulated from the semiconductor part 10 by an insulating film 55. For example, the insulating film 43, the insulating film 45, and the insulating film 47 are stacked in the direction (the Z-direction) from the drain electrode 20 toward the source electrode 30. The embodiment is not limited to the example; and the gate electrode 40 may be electrically insulated from the source electrode 30 by an insulating film having a continuous body.

The semiconductor part 10 includes an n-type drift layer 11 (a first semiconductor layer), a p-type base layer 13 (a second semiconductor layer), an n-type source layer 15 (a third semiconductor layer), a p-type contact layer 17, and an n-type drain layer 19.

The p-type base layer 13 is positioned between the n-type drift layer 11 and the source electrode 30. The n-type source layer 15 is positioned between the p-type base layer 13 and the source electrode 30. The n-type source layer 15 includes an n-type impurity with a higher concentration than the n-type impurity of the n-type drift layer 11. For example, the p-type contact layer 17 is provided in the p-type base layer 13 and includes a p-type impurity with a higher concentration than the p-type impurity of the p-type base layer 13.

As shown in FIG. 1, the source electrode 30 includes a contact part CP piercing the insulating film 45, the insulating film 47, an insulating film $55_T$, and the n-type source layer 15 and contacting the p-type contact layer 17. The source electrode 30 is electrically connected to the p-type contact layer 17 via the contact part CP. Also, the source electrode 30 is electrically connected to the p-type base layer 13 via the p-type contact layer 17. A side surface of the contact part CP contacts the n-type source layer 15 and is electrically connected to the n-type source layer 15. In other words, the source electrode 30 is electrically connected to the p-type base layer 13 and the n-type source layer 15 via the contact part CP.

For example, the source electrode 30 has a stacked structure including a barrier layer 33, a buried layer 35, and a bonding layer 37. The barrier layer 33 is the lowermost layer of the stacked structure; and the bonding layer 37 is the uppermost layer of the stacked structure. The barrier layer 33 is positioned between the buried layer 35 and the insulating film 47. The barrier layer 33 includes, for example, titanium nitride (TiN). The buried layer 35 is positioned between the barrier layer 33 and the bonding layer 37 and includes, for example, tungsten (W). The bonding layer 37 is, for example, a metal layer including aluminum (Al) or gold (Au). The buried layer is provided to fill the interior of a contact trench CT extending through the insulating film 45, the insulating film 47, and the n-type source layer 15 (referring to FIG. 13B). The buried layer 35 may be omitted if the interior of the contact trench CT can be filled with the barrier layer 33.

The n-type drain layer 19 is positioned between the n-type drift layer 11 and the drain electrode 20 and includes an n-type impurity with a higher concentration than the n-type impurity of the n-type drift layer 11. For example, the drain electrode 20 contacts the n-type drain layer 19 and is electrically connected to the n-type drain layer 19. The drain electrode 20 is, for example, a metal layer including aluminum (Al), gold (Au), etc.

Figure 2:
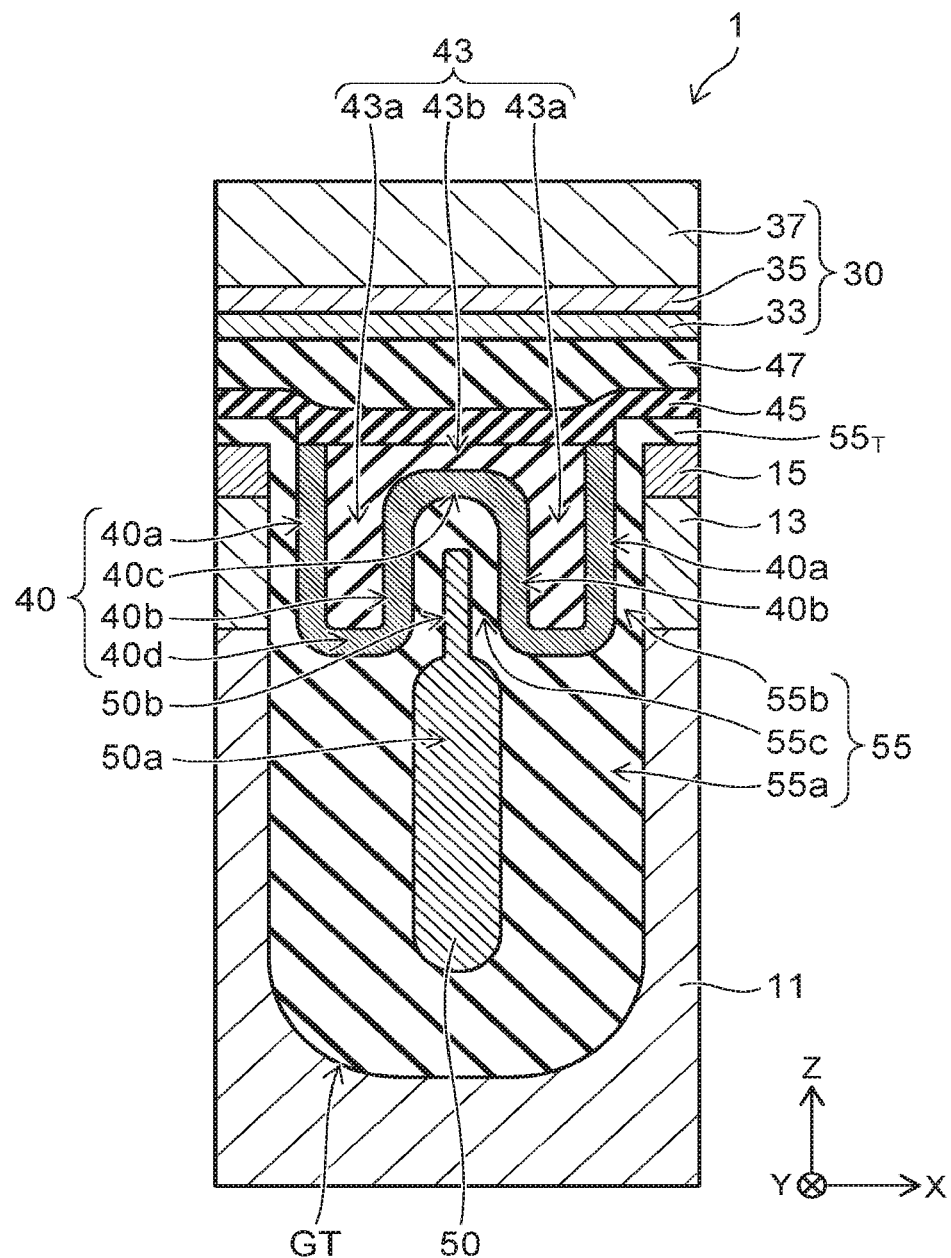
FIG. 2 is a schematic cross-sectional view showing the gate structure of the semiconductor device according to the embodiment.

FIG. 2 is a schematic cross-sectional view showing the gate structure of the semiconductor device 1 according to the embodiment. The gate electrode 40 is provided in the gate trench GT at the same level as the position in the Z-direction of the p-type base layer 13. The field plate electrode 50 is positioned in the n-type drift layer 11.

The gate electrode 40 is provided as a thin layer having a continuous body between the insulating film 43 and the insulating film 55. The gate electrode 40 includes, for example, a first portion 40a, a second portion 40b, a third portion 40c, and a fourth portion 40d.

The field plate electrode 50 includes a major portion 50a and an extension portion 50b. The major portion 50a is positioned in the n-type drift layer 11; and the extension portion 50b extends in the Z-direction from the major portion 50a. For example, the extension portion 50b is provided at the same level as the p-type base layer 13 in the Z-direction.

The insulating film 55 includes a first isolating portion 55a, a second isolating portion 55b, and a third isolating portion 55c; and the insulating film 43 includes, for example, a fourth isolating portion 43a and a fifth isolating portion 43b. The first isolating portion 55a is positioned between the n-type drift layer 11 and the major portion 50a of the field plate electrode 50 and electrically insulates the field plate electrode 50 from the n-type drift layer 11. The second isolating portion 55b is positioned between the p-type base layer 13 and the gate electrode 40 and functions as a gate insulating film. The third isolating portion 55c extends into the gate electrode 40 from the major portion 50a of the field plate electrode 50. The third isolating portion 55c is provided to cover the extension portion 50b of the field plate electrode 50 and is positioned between the gate electrode 40 and the extension portion 50b. In other words, the extension portion 50b is positioned inside the third isolating portion 55c. The third isolating portion 55c electrically insulates the field plate electrode 50 from the gate electrode 40.

The insulating film 43 includes the fourth isolating portion 43a and the fifth isolating portion 43b. The fourth isolating portion 43a extends into the gate electrode 40 from the source electrode 30 side and is positioned between the second isolating portion 55b and the third isolating portion 55c. The fifth isolating portion 43b is positioned between the third isolating portion 55c and the source electrode 30. The fourth isolating portion 43a is provided at the two sides of the third isolating portion 55c in a direction (e.g., the X-direction) parallel to the surface of the semiconductor part 10. For example, the fifth isolating portion 43b extends in the X-direction and is linked to the fourth isolating portions 43a positioned at the two sides of the third isolating portion 55c.

The first portion 40a of the gate electrode 40 is positioned between the second isolating portion 55b and the fourth isolating portion 43a. The second portion 40b of the gate electrode 40 is positioned between the third isolating portion 55c and the fourth isolating portion 43a. The third portion 40c of the gate electrode 40 is positioned between the third isolating portion 55c and the fifth isolating portion 43b. The fourth portion 40d of the gate electrode 40 is positioned between the fourth isolating portion 43a and the first isolating portion 55a. For example, the gate electrode 40 has a W-shaped cross-sectional configuration in a cross section parallel to the X-Z plane.

Figure 3:
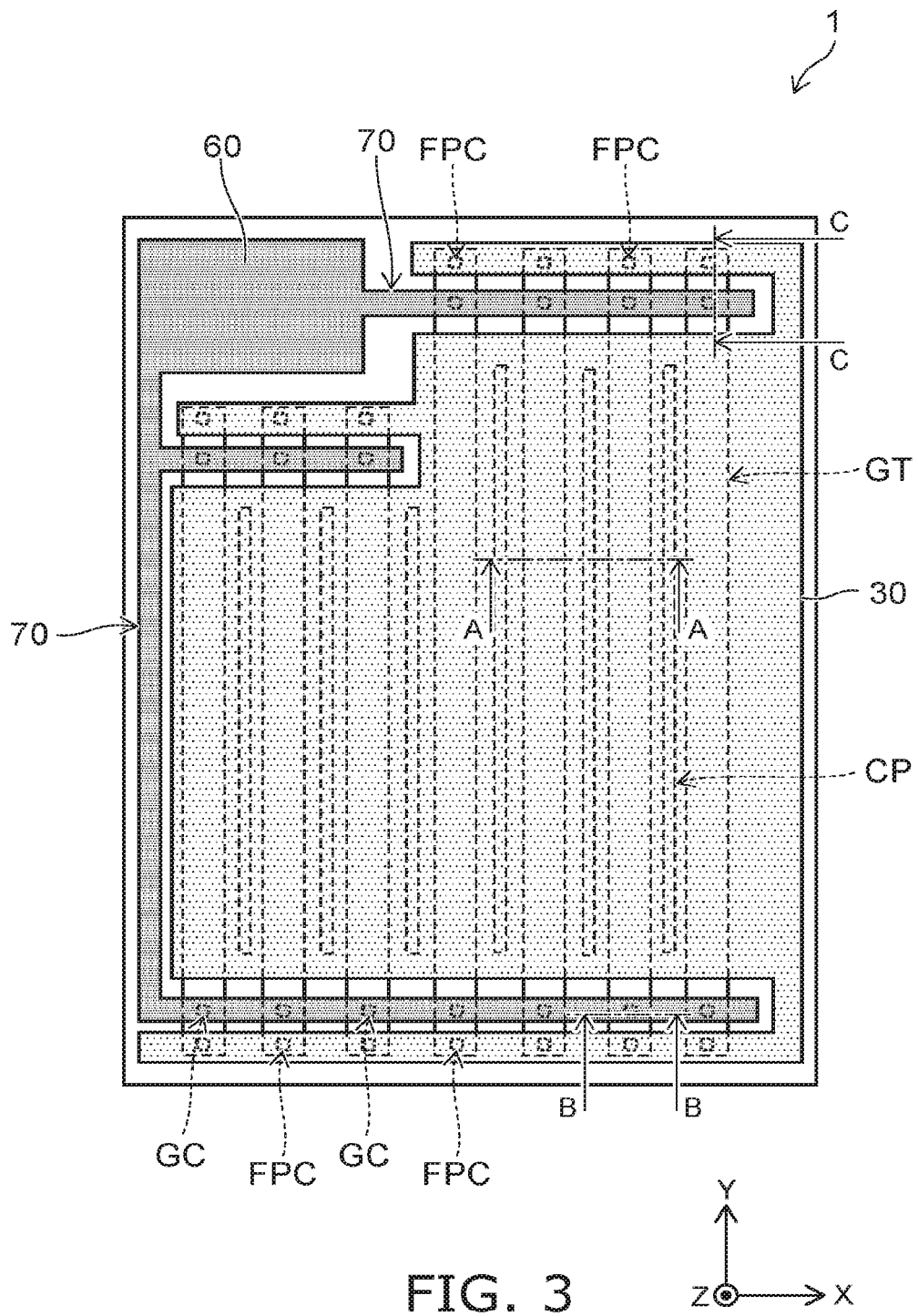
FIG. 3 is a schematic plan view showing the semiconductor device according to the embodiment.

FIG. 3 is a schematic plan view showing the semiconductor device 1 according to the embodiment. The semiconductor device 1 further includes a gate pad 60 and a gate interconnect 70. For example, the gate pad 60 and the gate interconnect 70 are provided on the semiconductor part 10 with the insulating film 45 and the insulating film 47 interposed.

Multiple gate trenches GT are provided as shown in FIG. 3. For example, the multiple gate trenches GT extend in the Y-direction and are arranged in the X-direction. The source electrode 30 is provided to cover the multiple gate trenches GT. The contact part CP of the source electrode 30 is positioned between adjacent gate trenches GT and extends in the Y-direction. Also, the source electrode 30 is electrically connected to the field plate electrode 50 via a field plate contact FPC (referring to FIG. 5).

The gate interconnect 70 crosses the multiple gate trenches GT and is connected to the gate pad 60. The gate pad 60 and the gate interconnect 70 are provided to be separated from the source electrode 30. The gate interconnect 70 is electrically connected via gate contacts GC to the gate electrodes 40 provided in the gate trenches GT (referring to FIG. 4A).

Figure 4A:
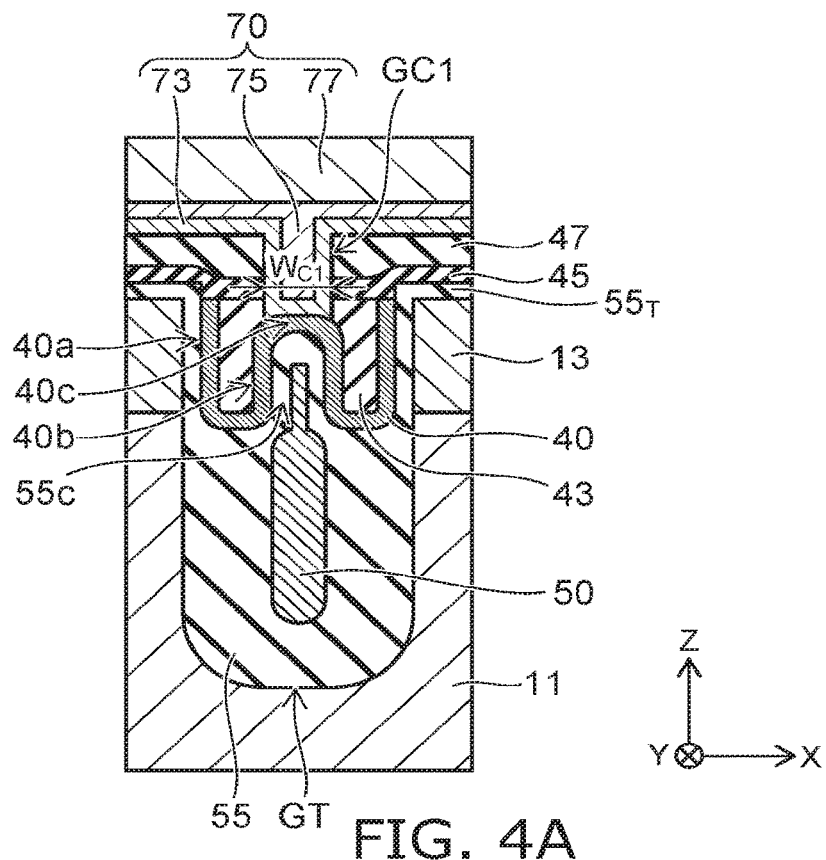
FIGS. 4A and 4B are schematic cross-sectional views showing a connection structure of the semiconductor device according to the embodiment.
Figure 4B:
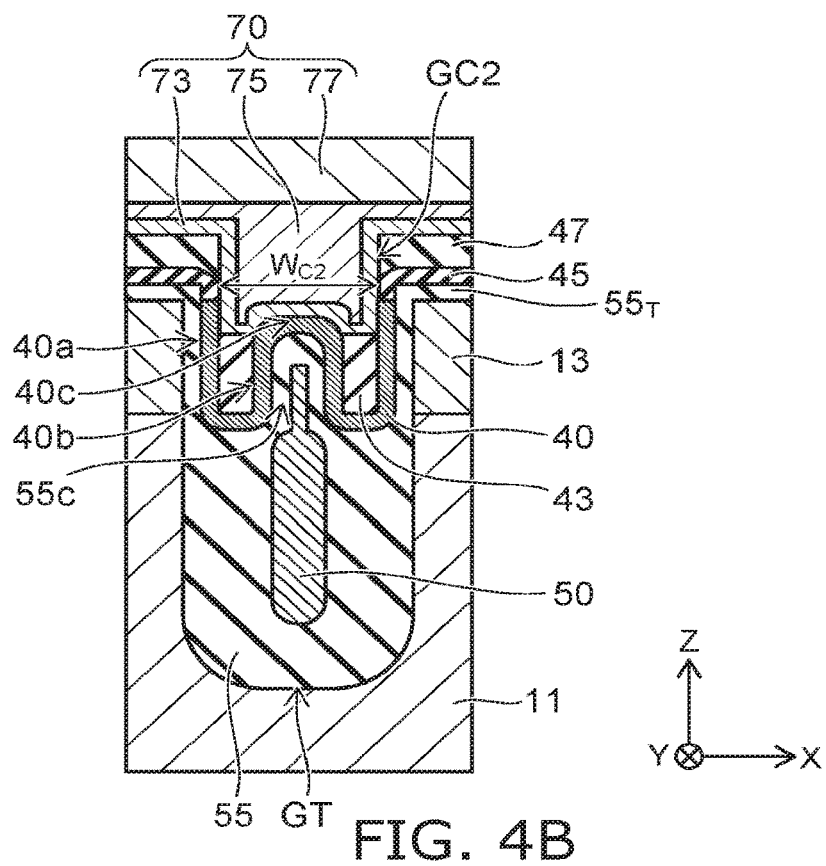

FIGS. 4A and 4B are schematic cross-sectional views showing a connection structure of the semiconductor device 1 according to the embodiment. FIGS. 4A and 4B are schematic views showing a cross section along line B-B shown in FIG. 3, and show the connection structure electrically connecting the gate electrode 40 and the gate interconnect 70.

As shown in FIG. 4A, the gate interconnect 70 has, for example, a stacked structure including a barrier layer 73, a buried layer 75, and an interconnect layer 77. For example, the barrier layer 73, the buried layer 75, and the interconnect layer 77 are stacked on the insulating film 47; and the buried layer 75 is positioned between the barrier layer 73 and the interconnect layer 77. The interconnect layer 77 is the uppermost layer of the stacked structure. The barrier layer 73 includes, for example, titanium nitride (TiN); and the buried layer 75 includes, for example, tungsten (W). The interconnect layer 77 includes, for example, aluminum (Al) or gold (Au). For example, the gate interconnect 70 is formed simultaneously with the source electrode 30 and has the same stacked structure.

The gate interconnect 70 includes a gate contact GC1. The gate contact GC1 extends through the insulating film 43, the insulating film 45, and the insulating film 47 and contacts the third portion 40c of the gate electrode 40. The gate contact GC1 electrically connects the gate electrode 40 and the gate interconnect 70. The gate contact GC1 is formed to fill a contact hole piercing the insulating film 43, the insulating film 45, and the insulating film 47 and communicating with the third portion 40c of the gate electrode 40. The gate contact GC1 includes a portion of the barrier layer 73 and a portion of the buried layer 75. If the contact hole can be filled with the barrier layer 73, the buried layer 75 is omitted; and the gate contact GC1 includes a portion of the barrier layer 73.

The insulating film 55 according to the embodiment includes a third isolating portion 55c extending into the gate electrode 40 from the field plate electrode 50 side between the portion of the gate electrode 40 facing the p-type base layer 13 with the gate insulating film (the second isolating portion 55b) interposed. The gate electrode 40 includes the third portion 40c covering the top portion of the third isolating portion 55c in the Z-direction. Therefore, the gate contact GC1 can be formed to connect the third portion 40c; and the connection of the gate interconnect 70 and the gate electrode 40 is easy.

As shown in FIG. 4B, a connection structure that includes a gate contact GC2 may be used. For example, a width $W_{C2}$ in the X-direction of the gate contact GC2 is wider than a width $W_{C1}$ in the X-direction of the gate contact GC1.

For example, the gate contact GC2 is provided to contact the upper ends of the third portion 40c and the second portion 40b of the gate electrode 40. Also, the gate contact GC2 may be provided to contact the upper end of the first portion 40a and the upper ends of the third portion 40c and the second portion 40b of the gate electrode 40.

Figure 5:
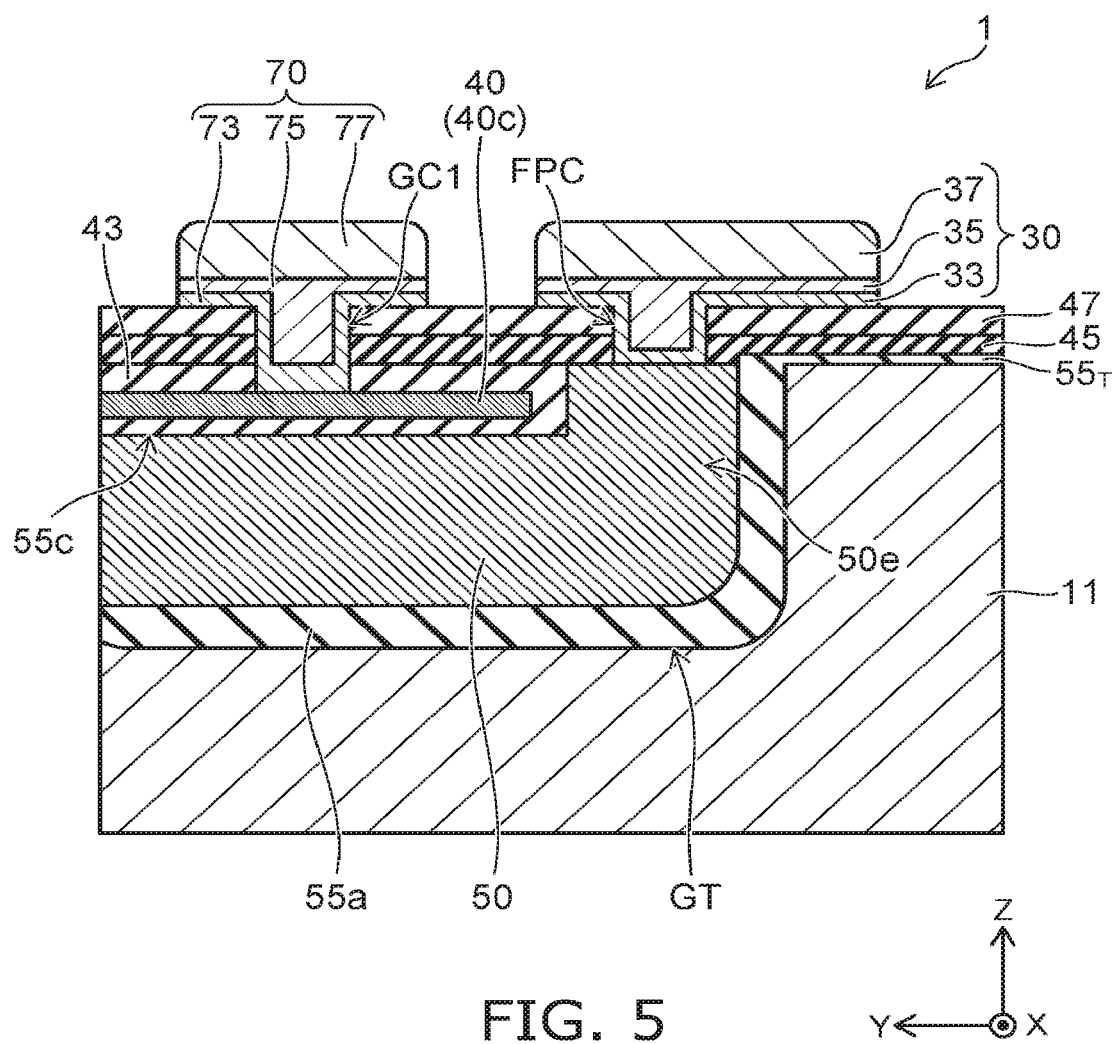
FIG. 5 is a schematic cross-sectional view showing another connection structure of the semiconductor device according to the embodiment.

FIG. 5 is a schematic cross-sectional view showing another connection structure of the semiconductor device according to the embodiment. FIG. 5 is a schematic view illustrating a cross section along line C-C shown in FIG. 3. FIG. 5 is a schematic view showing the connection structure of the source electrode 30 and the field plate electrode 50.

As shown in FIG. 5, the gate electrode 40 is electrically connected to the gate interconnect 70 via the gate contact GC1. On the other hand, the field plate electrode 50 is electrically connected to the source electrode 30 via the field plate contact FPC at an end portion 50e of the field plate electrode 50.

The end portion 50e of the field plate electrode 50 extends in the direction toward the source electrode 30 at the end of the gate trench GT.

A method for manufacturing the semiconductor device 1 will now be described with reference to FIG. 6A to FIG. 14B. FIG. 6A to FIG. 14B are schematic cross-sectional views showing manufacturing processes of the semiconductor device 1 according to the embodiment in order.

Figure 6A:
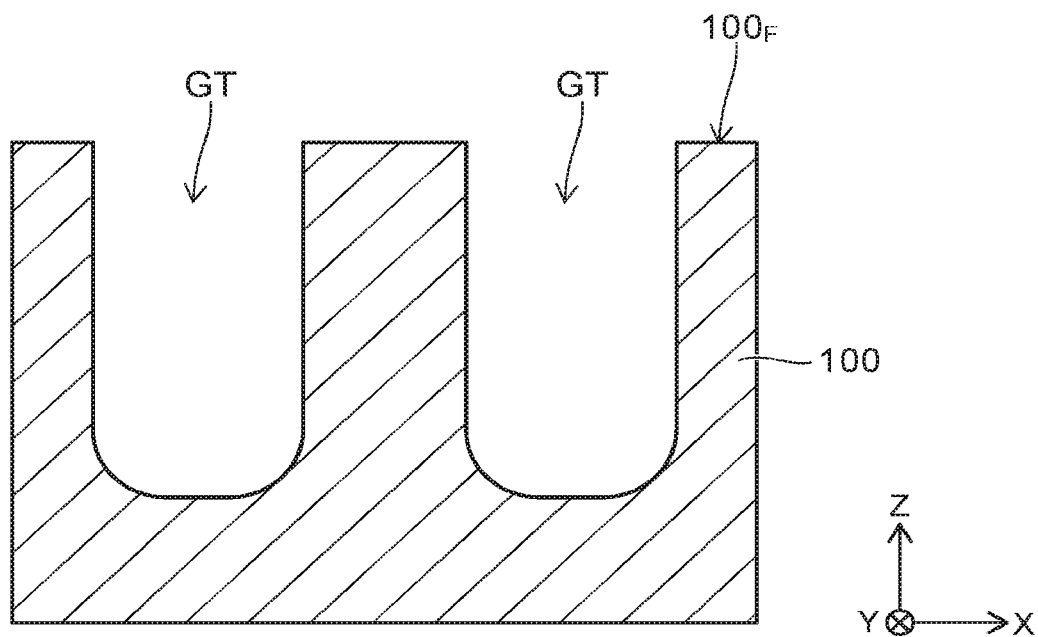
FIG. 6A to FIG. 14B are schematic cross-sectional views showing manufacturing processes of the semiconductor device according to the embodiment.

As shown in FIG. 6A, the gate trench GT is formed at a front surface $100_F$ side of a semiconductor wafer 100. The semiconductor wafer is, for example, a silicon wafer and includes an n-type impurity with the same concentration as the n-type impurity of the n-type drift layer 11. For example, the gate trench GT is formed by selectively removing the semiconductor wafer 100 by using a not-illustrated etching mask. For example, the semiconductor wafer 100 is removed using RIE (Reactive Ion Etching).

Figure 6B:
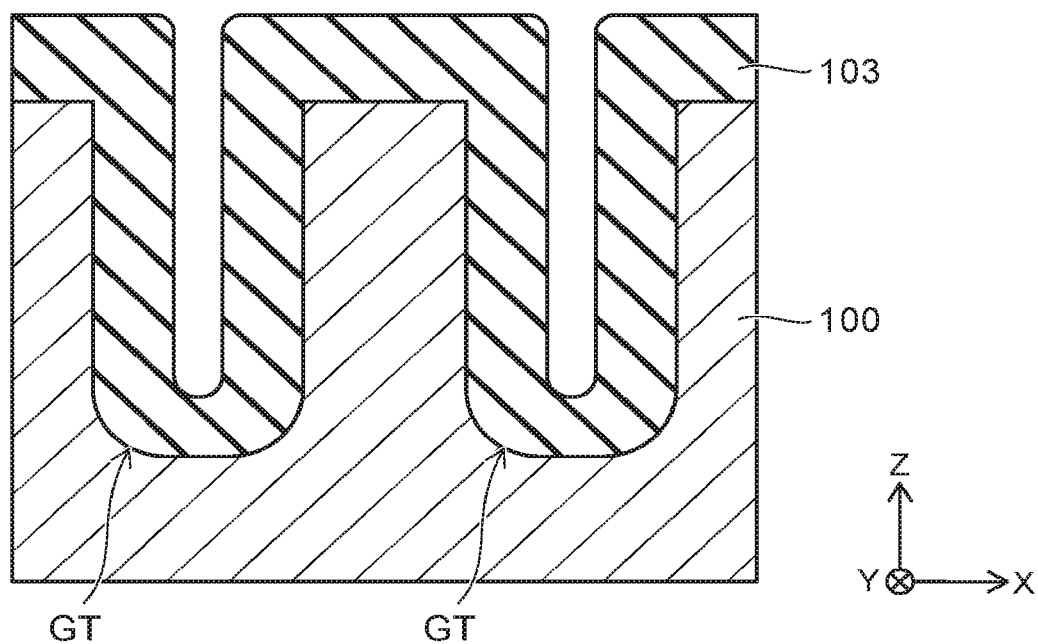

As shown in FIG. 6B, the inner surface of the gate trench GT and the surface of the semiconductor wafer 100 are covered by forming an insulating film 103. The insulating film 103 is, for example, a silicon oxide film formed using CVD (Chemical Vapor Deposition). The insulating film 103 is formed to have a thickness such that a space remains in the gate trench GT.

Figure 7A:
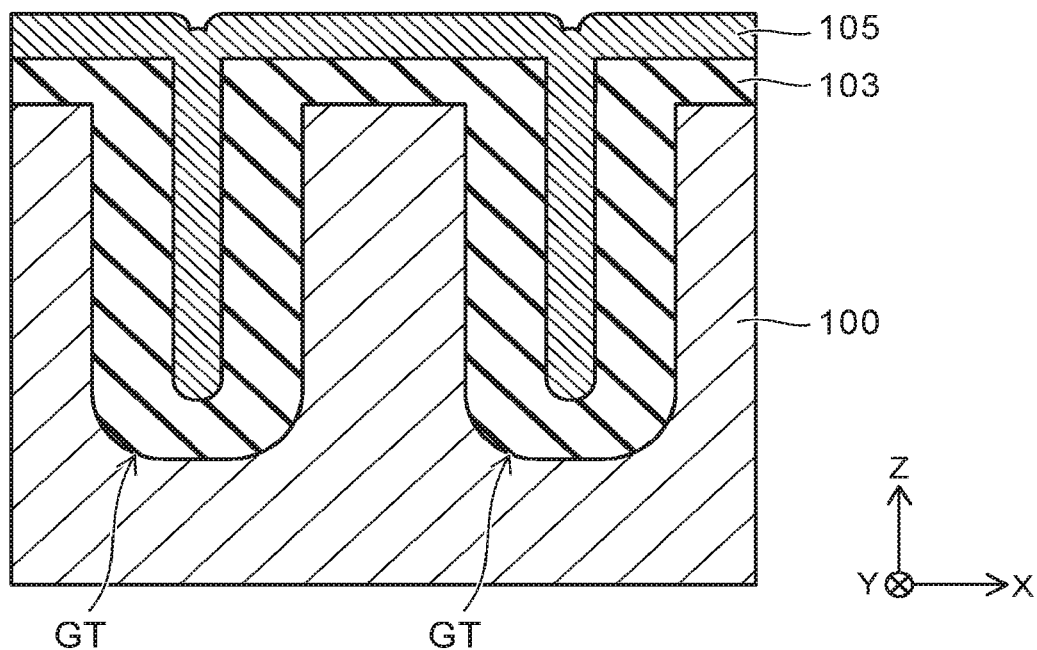

As shown in FIG. 7A, the insulating film 103 is covered by forming a conductive film 105. The conductive film 105 is formed to fill the space inside the gate trench GT. The conductive film 105 is, for example, a conductive polysilicon film formed using CVD. The conductive film 105 may be a metal film of titanium nitride (TiN), tungsten (W), etc.

Figure 7B:
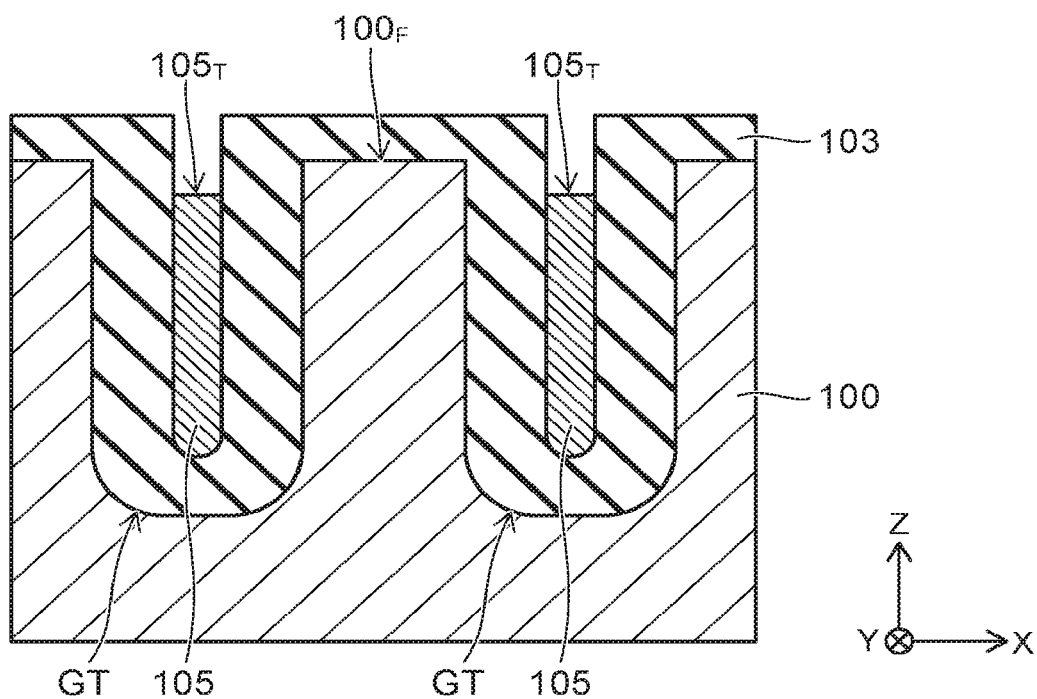

As shown in FIG. 7B, the conductive film 105 is selectively removed so that a portion of the conductive film 105 remains in the gate trench GT. For example, the conductive film 105 is selectively removed using wet etching. The conductive film 105 that remains in the gate trench GT includes an upper end $105_T$; and the upper end $105_T$ is positioned lower than the front surface $100_F$ of the semiconductor wafer 100 in the Z-direction.

Figure 8A:
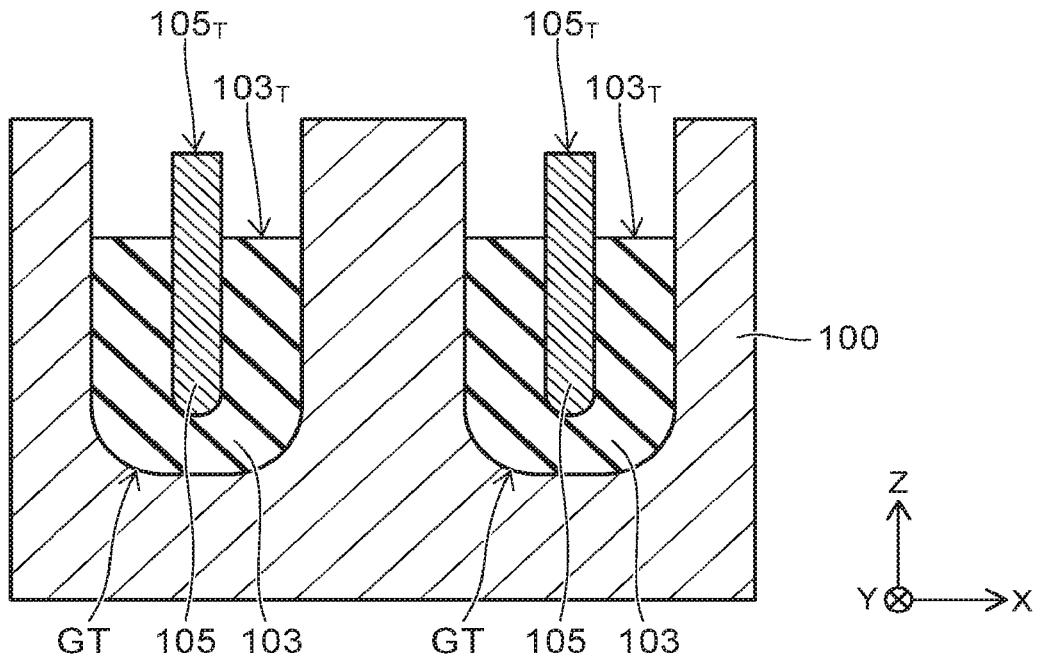

As shown in FIG. 8A, the insulating film 103 is selectively removed so that a portion of the insulating film 103 remains in the gate trench GT. For example, the insulating film 103 is selectively removed using wet etching. The insulating film 103 that remains in the gate trench GT includes an upper end $103_T$ positioned lower than the upper end $105_T$ of the conductive film 105 in the Z-direction.

Figure 8B:
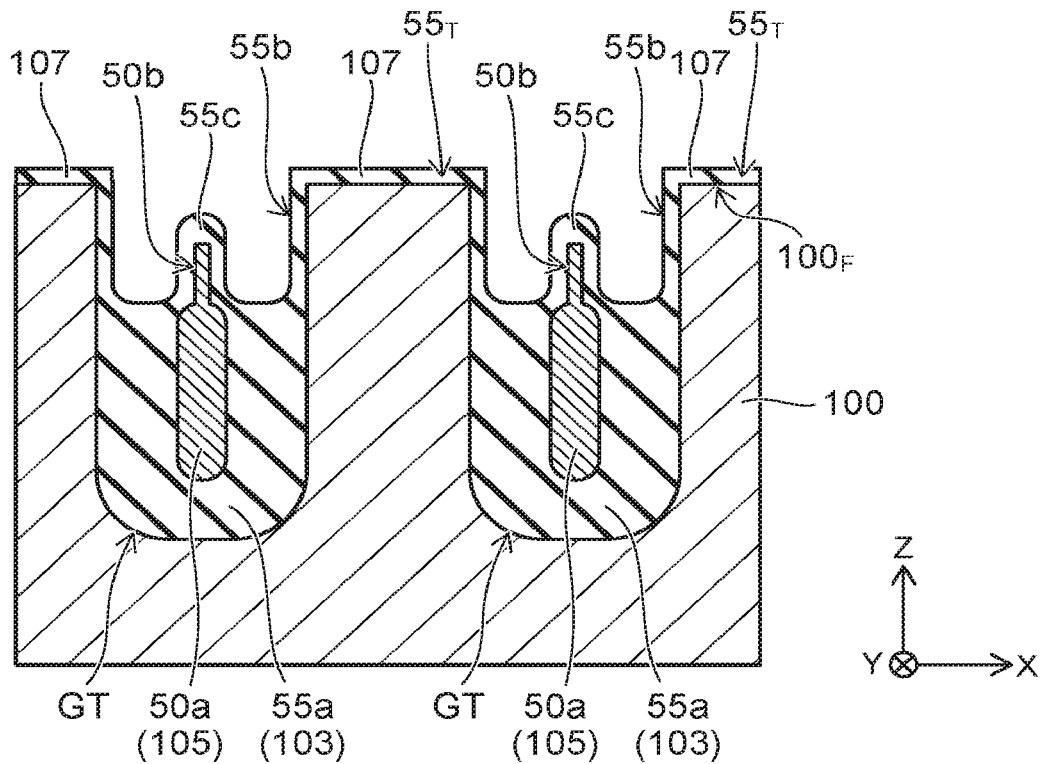

As shown in FIG. 8B, the major portion 50a and the extension portion 50b of the field plate electrode 50 are formed in the gate trench GT. The major portion 50a is the portion of the conductive film 105 positioned inside the insulating film 103. The insulating film 103 becomes the first isolating portion 55a. For example, the extension portion 50b is formed by performing thermal oxidation of a portion of the conductive film 105 exposed in the space after removing the portion of the insulating film 103. In other words, the third isolating portion 55c is formed by performing thermal oxidation of the conductive film 105; and the portion of the conductive film 105 remaining inside the third isolating portion 55c becomes the extension portion 50b. The third isolating portion 55c is, for example, a silicon oxide film.

An insulating film 107 is formed by performing thermal oxidation of the exposed surface of the semiconductor wafer 100. The insulating film 107 is formed on the front surface $100_F$ of the semiconductor wafer 100 and on the inner surface of the gate trench GT exposed at the upper portion of the gate trench GT. The insulating film 107 is, for example, a silicon oxide film and is formed simultaneously with the third isolating portion 55c. The portion of the insulating film 107 formed at the upper portion of the gate trench GT becomes the second isolating portion 55b. The portion of the insulating film 107 formed on the front surface $100_F$ of the semiconductor wafer 100 becomes the insulating film $55_T$.

Figure 9A:
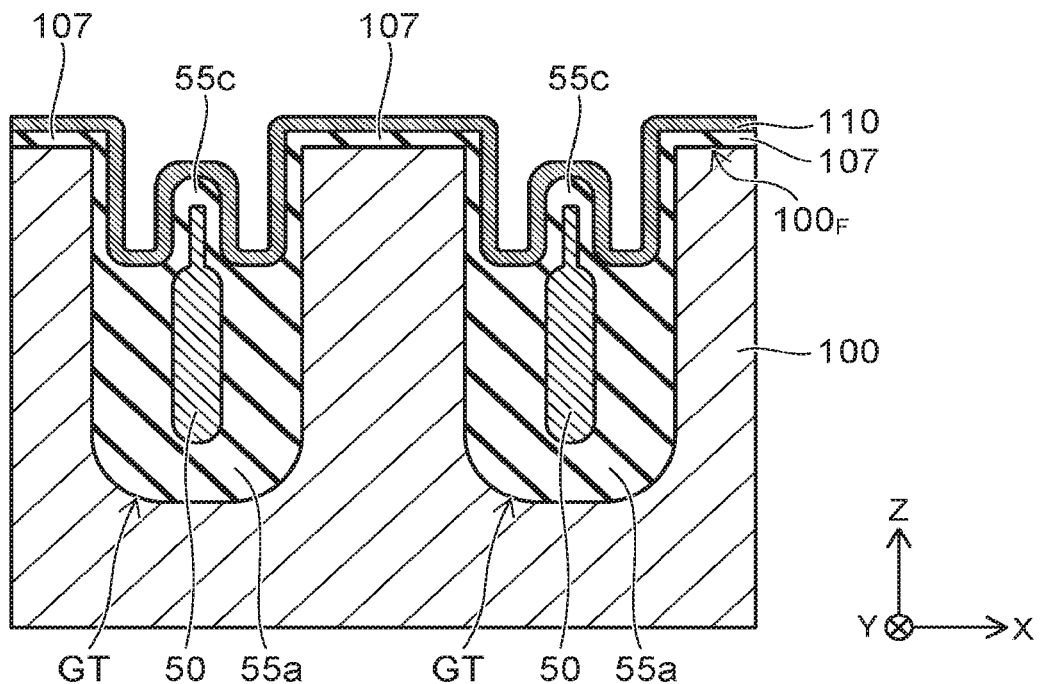

As shown in FIG. 9A, the first isolating portion 55a, the third isolating portion 55c, and the insulating film 107 are covered by forming a conductive film 110. The conductive film 110 is, for example, a conductive polysilicon film formed using CVD. The conductive film 110 is formed so that a space remains between the third isolating portion 55c and the insulating film 107. The conductive film 110 contacts the first isolating portion 55a, the third isolating portion 55c, and the insulating film 107 and is formed to cover the first isolating portion 55a, the third isolating portion 55c, and the insulating film 107 without leaving gaps.

Figure 9B:
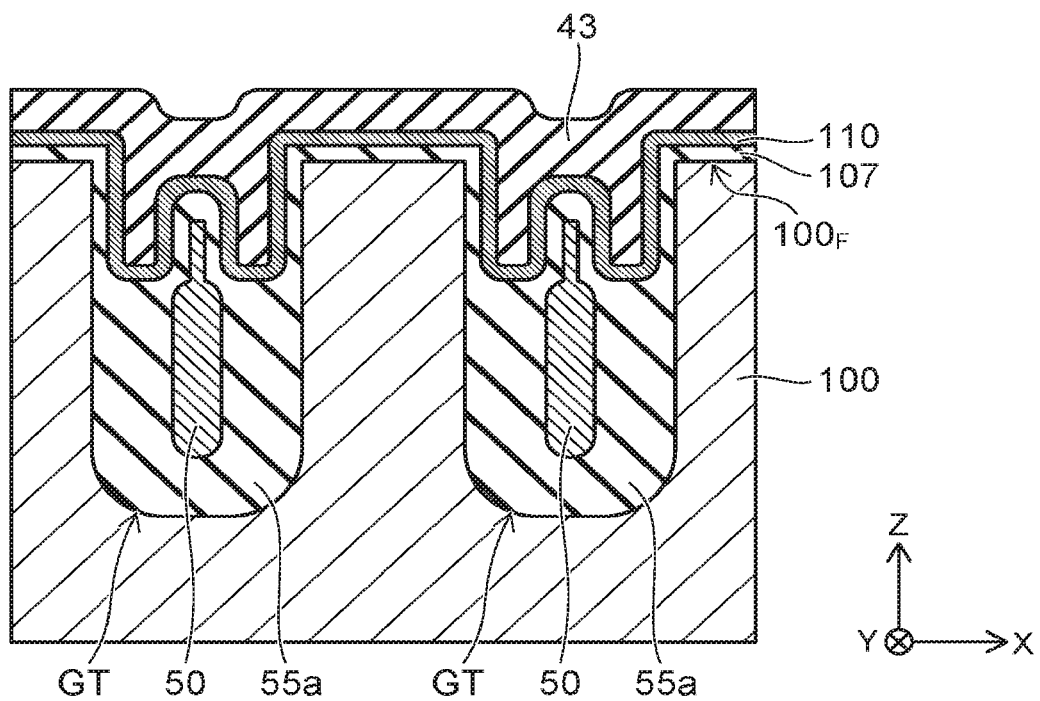

As shown in FIG. 9B, the conductive film 110 is covered by forming the insulating film 43. For example, the insulating film 43 is formed to fill the space at the upper portion of the gate trench GT by using CVD. The insulating film 43 includes, for example, so-called BPSG, i.e., silicate glass to which boron (B) and phosphorus (P) are added.

Figure 10A:
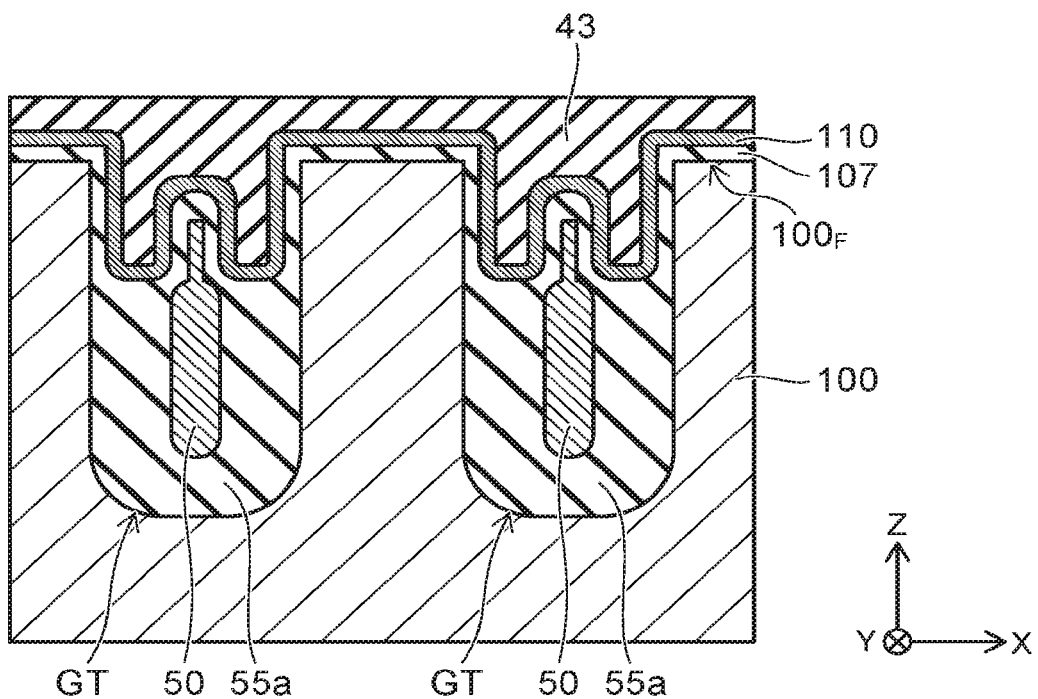

As shown in FIG. 10A, the insulating film 43 is planarized. For example, the surface of the insulating film 43 is planarized by performing heat treatment at a temperature higher than the softening point of the BPSG film.

Figure 10B:
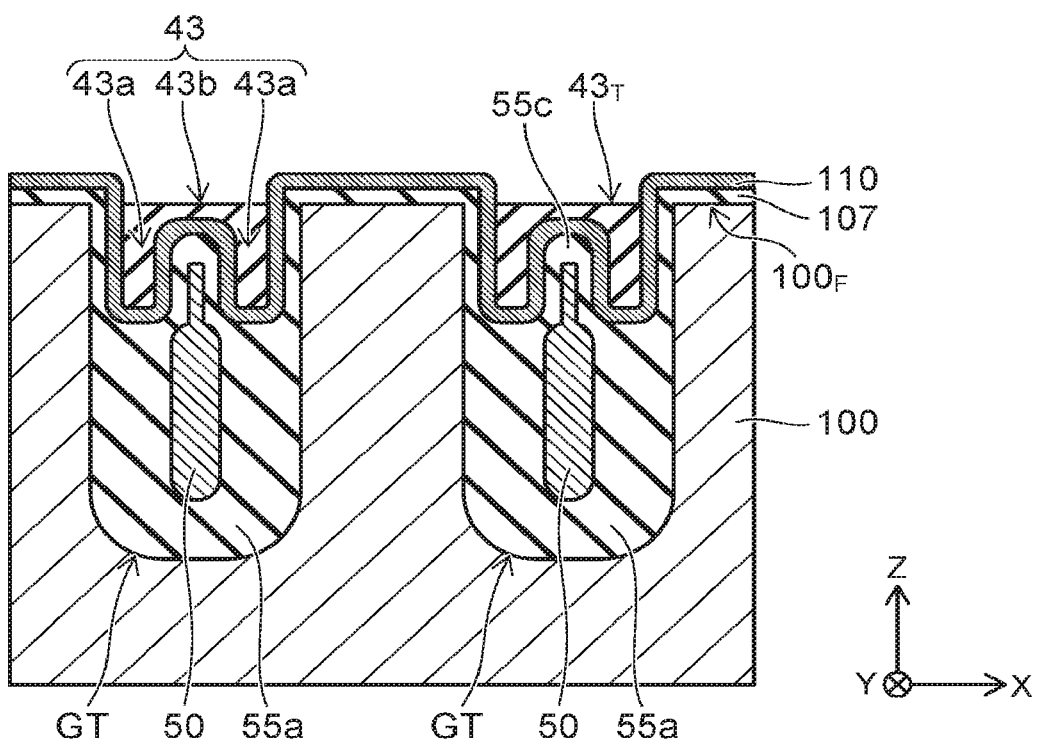

As shown in FIG. 10B, the insulating film 43 is selectively removed so that a portion of the insulating film 43 remains in the gate trench GT. For example, the insulating film 43 is removed by dry etching. A portion of the conductive film 110 positioned on the front surface $100_F$ of the semiconductor wafer 100 is exposed thereby. An upper surface $43_T$ of the insulating film 43 remaining in the gate trench GT is at the same level or lower than the front surface $100_F$ of the semiconductor wafer 100 in the Z-direction.

Figure 11A:
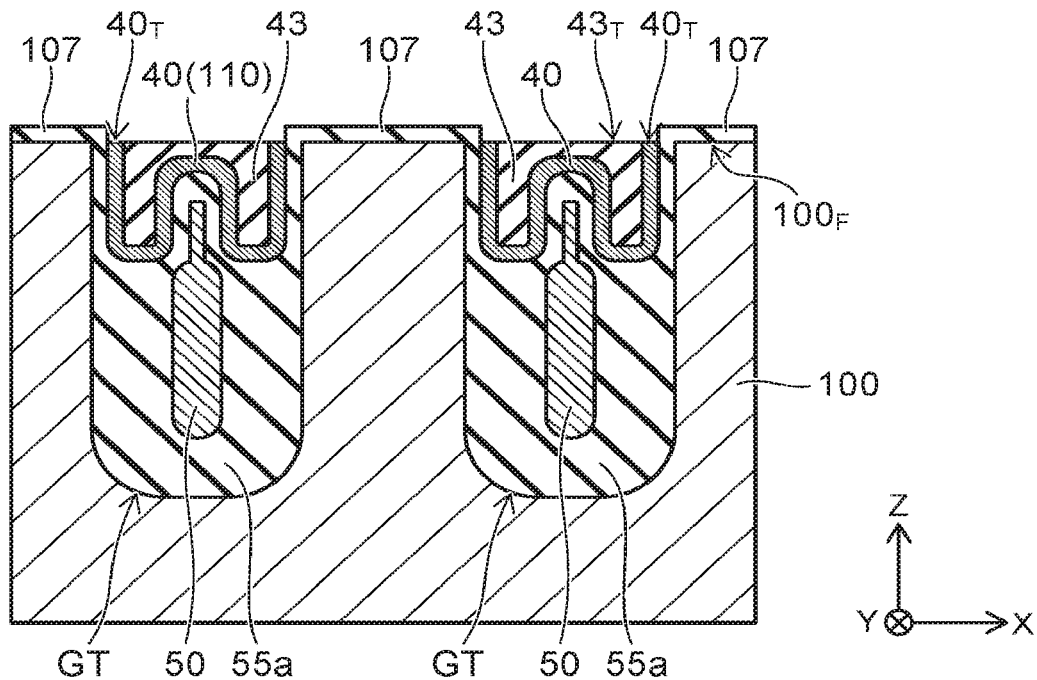

As shown in FIG. 11A, the conductive film 110 is selectively removed so that the portion of the conductive film 110 positioned inside the gate trench GT remains. For example, the conductive film 110 is removed using wet etching. Thereby, the gate electrode 40 is formed in the gate trench GT. An upper end $40_T$ of the gate electrode 40 is at a level same as or lower than the front surface $100_F$ of the semiconductor wafer 100 in the Z-direction. Also, the upper end $40_T$ is positioned at a level higher than the other portions of the gate electrode 40 in the Z-direction.

Figure 11B:
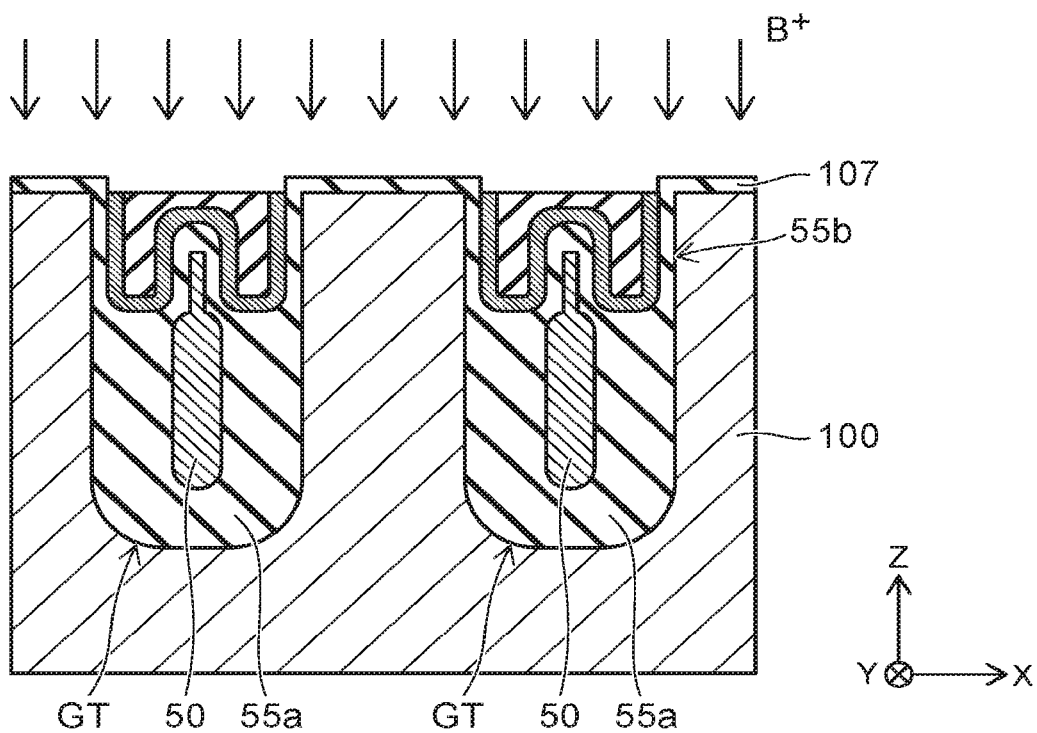

As shown in FIG. 11B, a p-type impurity, e.g., boron (B) is ion-implanted into the front surface side of the semiconductor wafer 100 where the gate trench GT is provided.

Figure 12A:
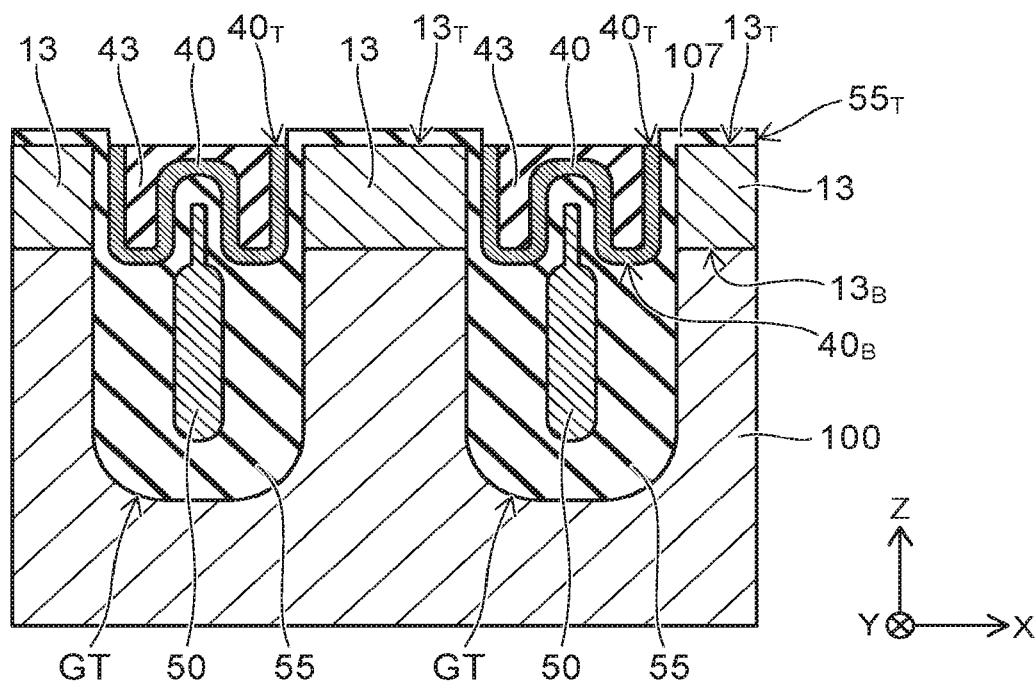

As shown in FIG. 12A, the p-type base layer 13 is formed at the front surface side of the semiconductor wafer 100. The p-type base layer 13 is formed by performing heat treatment to activate and diffuse the ion-implanted p-type impurity. A boundary $13_B$ between the p-type base layer 13 and the n-type drift layer 11 is positioned higher than a lower end $40_B$ of the gate electrode 40 in the Z-direction. It is favorable for the boundary $13_B$ to be positioned at the vicinity of the lower end $40_B$ of the gate electrode 40 in the Z-direction.

Figure 12B:
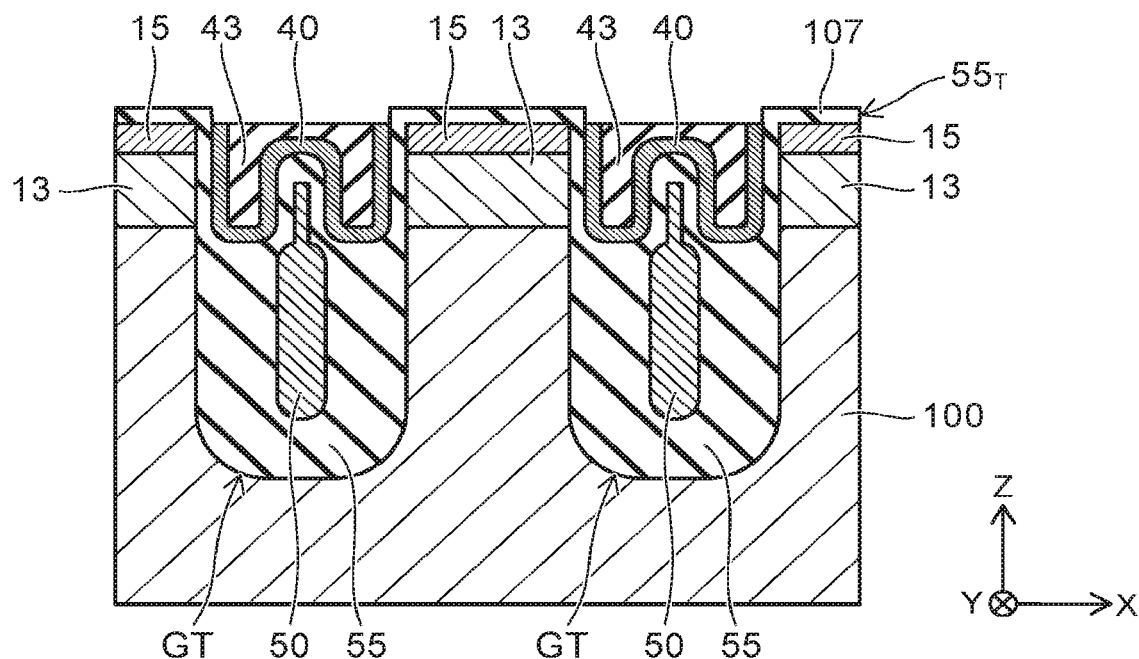

As shown in FIG. 12B, the n-type source layer 15 is formed on the p-type base layer 13. The n-type source layer is formed by ion-implanting an n-type impurity, e.g., phosphorus (P) and by activating by performing heat treatment.

Figure 13A:
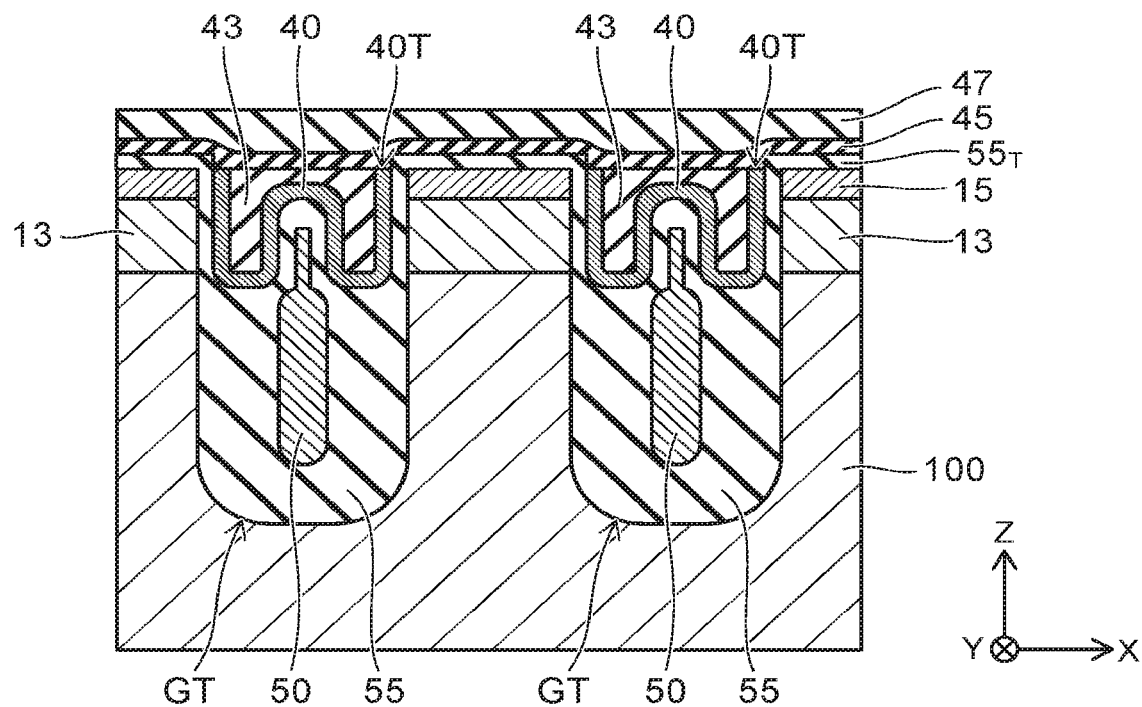

As shown in FIG. 13A, the semiconductor wafer 100, the gate electrode 40 formed in the gate trench GT, and the insulating film 43 are covered by forming the insulating film 45 and the insulating film 47. The insulating film 45 is, for example, a silicon oxide film formed by CVD. The insulating film 47 is, for example, a BPSG film formed by CVD. The insulating film 45 is positioned between the insulating film 43 and the insulating film 47.

Figure 13B:
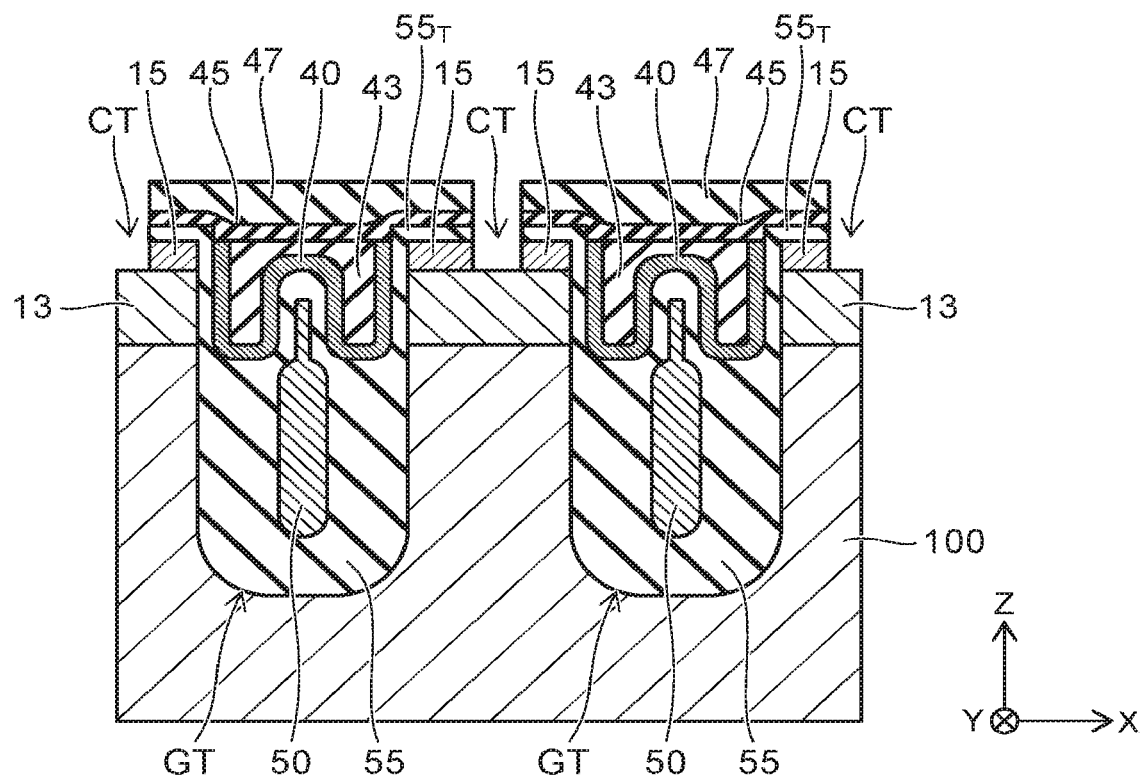

As shown in FIG. 13B, the contact trench CT is formed by selectively removing the insulating film 47, the insulating film 45, the insulating film $55_T$, and the n-type source layer 15. For example, the contact trench CT extends through the n-type source layer 15 and is formed to a depth reaching the p-type base layer 13.

Figure 14A:
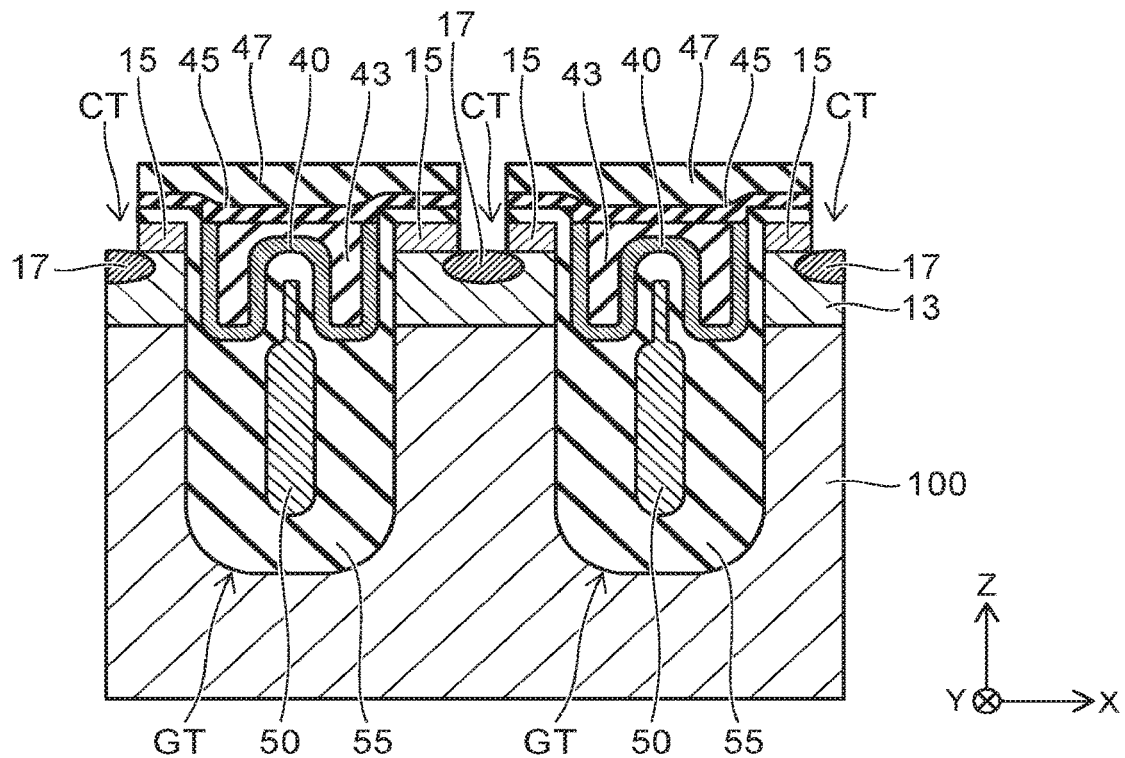

Continuing, a p-type impurity, e.g., boron (B) is ion-implanted into the p-type base layer 13 via the contact trench CT. As shown in FIG. 14A, the p-type contact layer 17 is formed by performing heat treatment to activate the ion-implanted p-type impurity.

The contact trench CT may be formed so that the bottom surface of the contact trench CT is positioned higher than the p-type base layer 13. In other words, a portion of the n-type source layer 15 may remain on the p-type base layer 13. For example, the p-type impurity of the p-type contact layer 17 is ion-implanted with a higher concentration than the n-type impurity of the n-type source layer 15. As a result, at least a portion of the p-type contact layer 17 may be positioned in the n-type source layer 15.

Figure 14B:
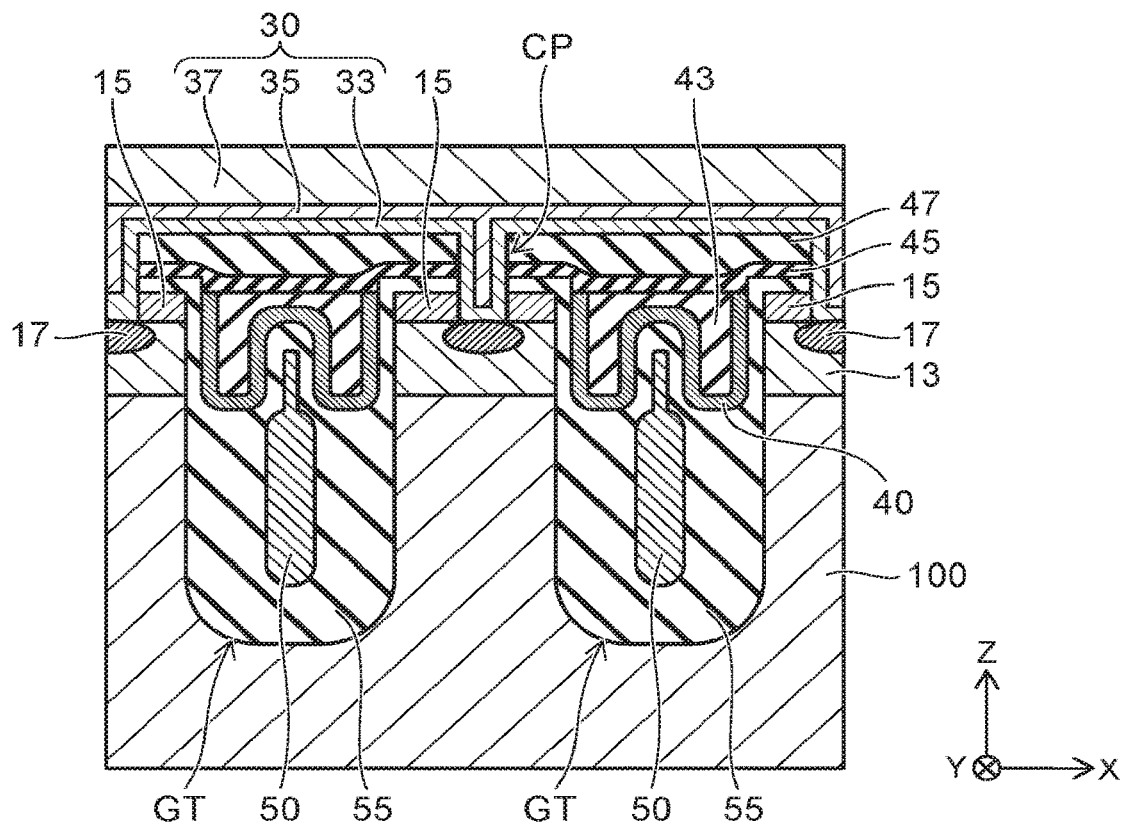

As shown in FIG. 14B, the source electrode 30 is formed on the insulating film 47. The source electrode 30 includes the contact part CP extending into the contact trench CT. The source electrode 30 is formed by depositing the barrier layer 33, the buried layer 35, and the bonding layer 37 in order.

The barrier layer 33 is, for example, a titanium nitride layer formed using sputtering. The barrier layer 33 is formed to cover the surface of the insulating film 47 and the inner surface of the contact trench CT. The buried layer 35 is, for example, a tungsten layer formed using CVD. The buried layer 35 is formed to fill the interior of the contact trench CT. The bonding layer 37 is, for example, an aluminum layer formed using sputtering.

Continuing, the backside of the semiconductor wafer 100 is thinned to a prescribed thickness by polishing. The n-type drain layer 19 is formed by ion-implanting an n-type impurity, e.g., phosphorus (P) into the backside of the semiconductor wafer 100; subsequently, the drain electrode 20 is formed on the back surface of the semiconductor wafer 100. The portion of the semiconductor wafer 100 positioned between the p-type base layer 13 and the n-type drain layer 19 becomes the n-type drift layer 11.

FIG. 15A to FIG. 17B are schematic cross-sectional views showing manufacturing processes of a semiconductor device 2 according to a comparative example. FIG. 15A to FIG. 17B are schematic views showing manufacturing processes continuing from FIG. 8B.

Figure 15A:
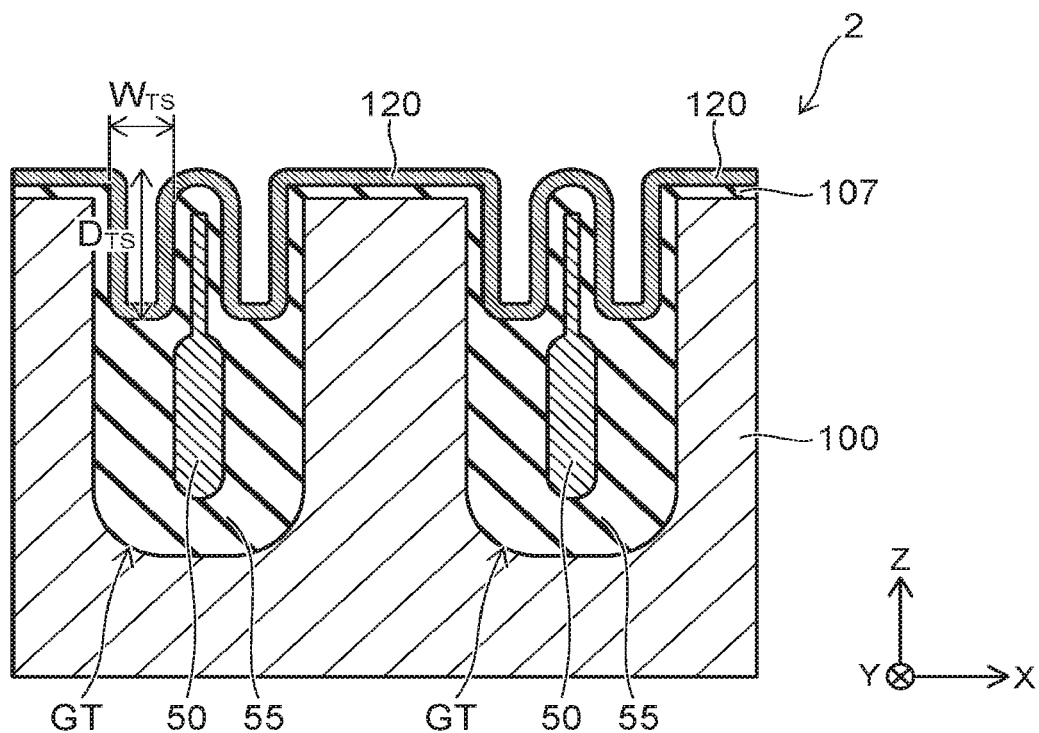
FIG. 15A to FIG. 17B are schematic cross-sectional views showing manufacturing processes of a semiconductor device according to a comparative example.

As shown in FIG. 15A, a conductive film 120 is formed to cover the inner surface of the space at the upper portion of the gate trench GT. The conductive film 120 is, for example, a polysilicon film formed using CVD.

Figure 15B:
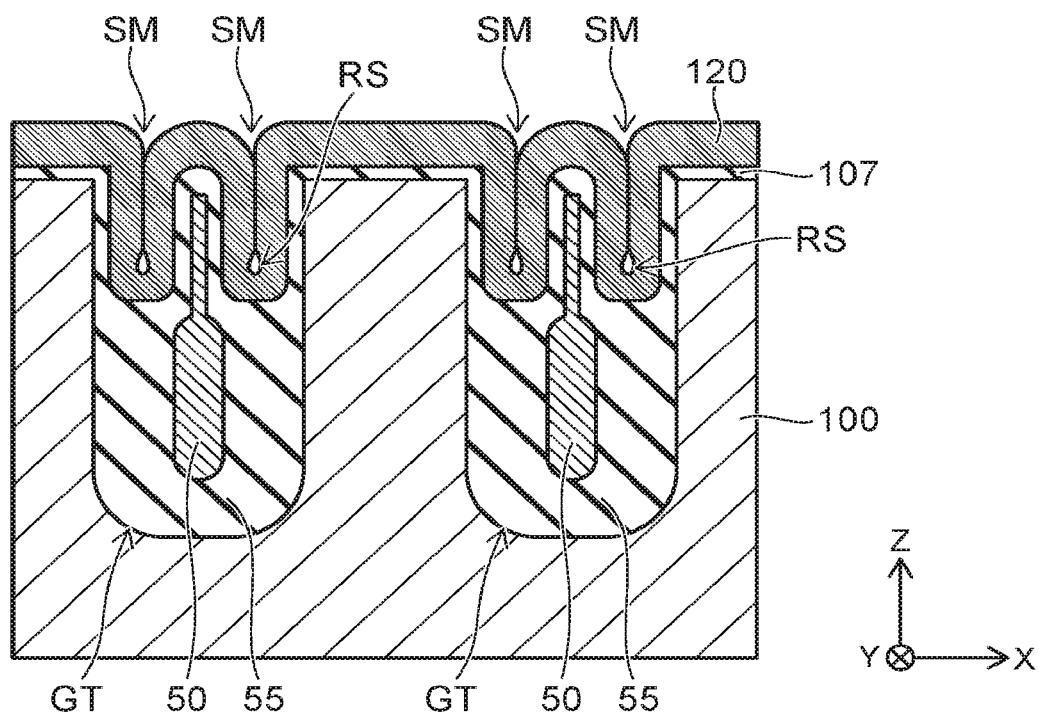

As shown in FIG. 15B, the space at the upper portion of the gate trench GT is filled by forming the conductive film 120 to be thick. For example, when the aspect ratio ($D_{TS}/W_{TS}$) of the space becomes large (referring to FIG. 15A), the portions of the conductive film 120 deposited on the inner walls contact each other; and the conductive film 120 fills the space. Thereby, a so-called seam SM is formed in the space interior. In such a case, if the deposition rate of the portion of the conductive film 120 proximal to the opening is high, there are cases where the upper portion is plugged and a cavity RS remains at portions where the seam SM is positioned.

Continuing, the resistance of the conductive film 120 is reduced by, for example, ion-implanting phosphorus (P) which is an n-type impurity. In the heat treatment process for activating the ion-implanted n-type impurity, the polysilicon is recrystallized; and, for example, the seam SM disappears. However, there are cases where a so-called void forms due to the cavity RS because the space interior is not filled completely.

Figure 16A:
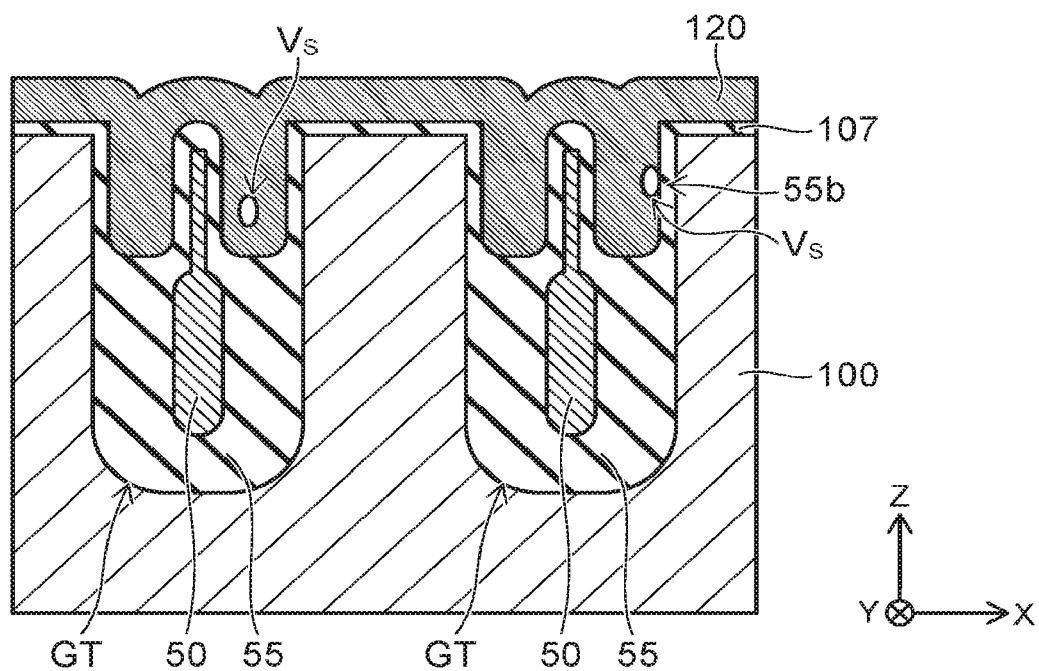

As shown in FIG. 16A, voids $V_S$ that are formed in the conductive film 120 filling the upper portion of the trench GT are not limited to locations where the seam SM exists, and are positioned at various locations. For example, as shown in FIG. 16A, there are cases where the void $V_S$ is formed also at a position proximal to the isolating portion 55b.

Figure 16B:
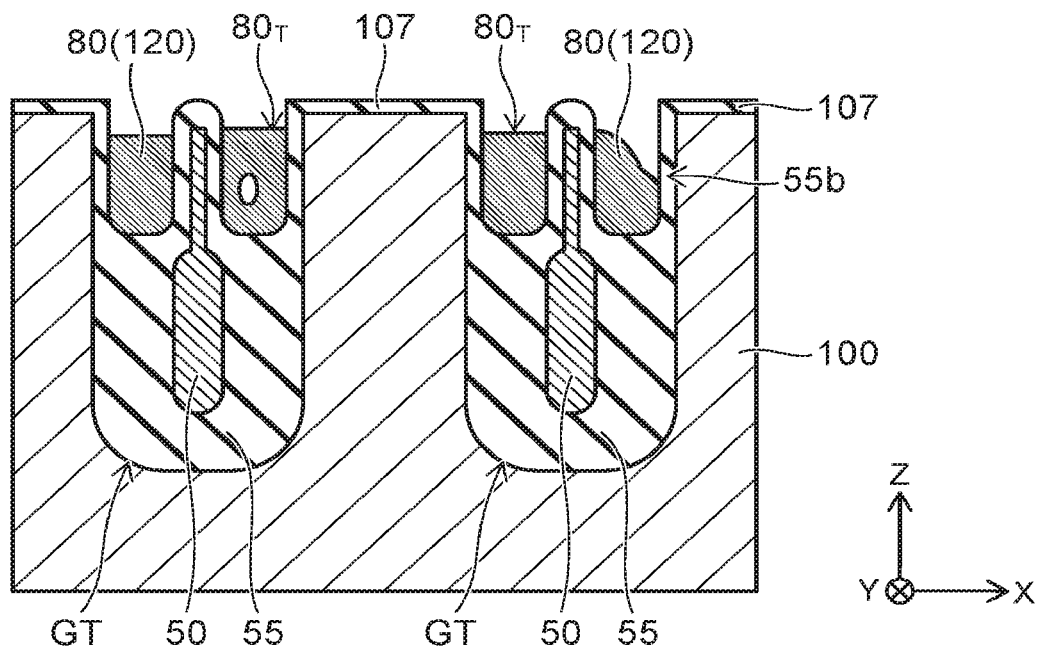

As shown in FIG. 16B, a gate electrode 80 is formed by performing etch-back of the conductive film 120 so that the portion of the conductive film 120 filling the upper portion space of the gate trench GT remains. The portion of the insulating film 107 positioned at the upper portion of the gate trench GT becomes the second isolating portion 55b and functions as a gate insulating film.

For example, the gate electrode 80 is formed so that an upper surface $80_T$ of the gate electrode 80 is positioned lower than an upper surface $13_T$ of the p-type base layer 13 in the Z-direction. However, for example, the etch-back amount of the conductive film 120 is not always constant in the wafer surface; and the position of the upper surface $80_T$ of the gate electrode 80 with respect to the upper surface $13_T$ of the p-type base layer 13 includes patterning fluctuation. Also, when the void $V_S$ exists at a position proximal to the isolating portion 55b, there are cases where the etching progresses along the interface between the isolating portion 55b and the conductive film 120; and a recess that is deeper than the other portions of the upper surface $80_T$ is formed.

Figure 17A:
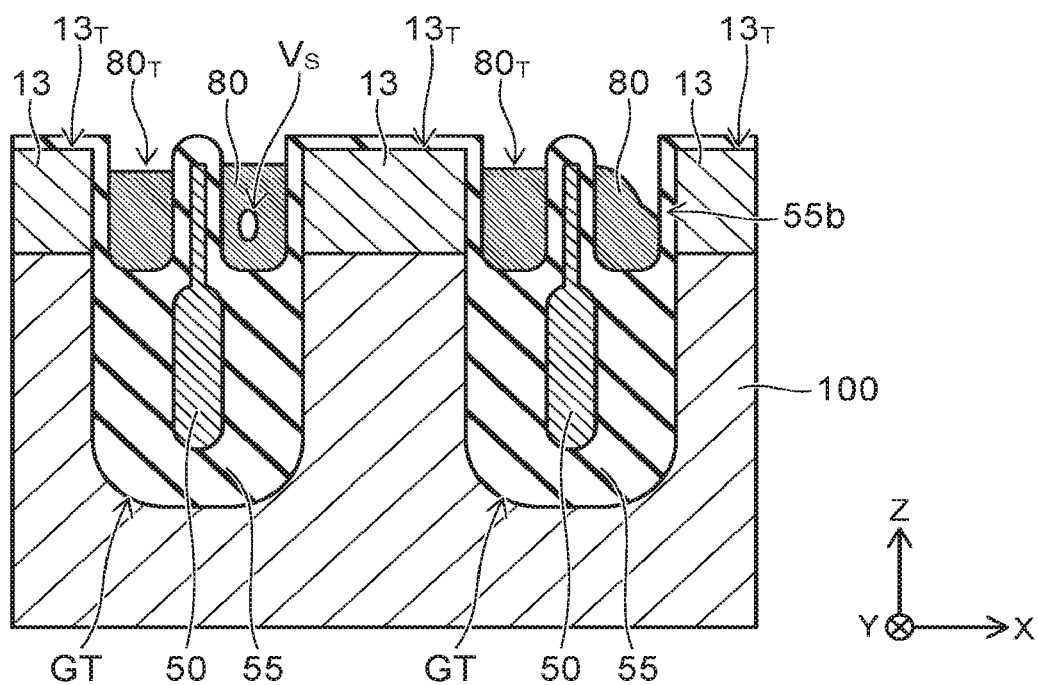

The p-type base layer 13 is formed as shown in FIG. 17A. The p-type base layer 13 is formed so that the lower end of the p-type base layer 13 is positioned shallower than the lower end of the gate electrode 80.

Figure 17B:
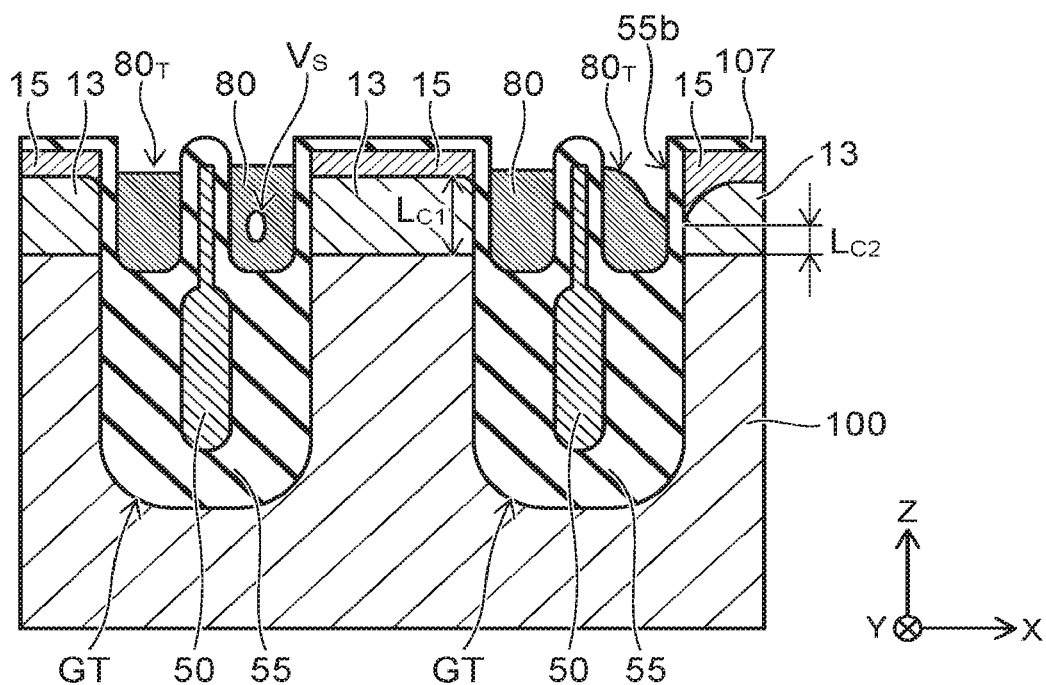

Continuing as shown in FIG. 17B, the n-type source layer 15 is formed on the p-type base layer 13.

For example, the n-type impurity that is used to form the n-type source layer 15 is activated so as not to diffuse in the heat treatment after being ion-implanted. Therefore, the position of the lower end of the portion of the n-type source layer 15 contacting the second isolating portion 55b changes and is dependent on the position of the upper surface $80_T$ of the gate electrode 80 with respect to the upper surface $13_T$ of the p-type base layer 13 before forming the n-type source layer 15. In other words, if the upper surface $80_T$ of the gate electrode 80 is at a position proximal to the upper surface $13_T$ of the p-type base layer 13 before forming the n-type source layer 15, the lower end of the n-type source layer 15 is formed at a shallow position with respect to the upper surface $13_T$. Also, if the upper surface $80_T$ of the gate electrode 80 is at a position separated from the upper surface $13_T$ of the p-type base layer 13 before forming the n-type source layer 15, the lower end of the n-type source layer 15 is formed at a deep position with respect to the upper surface $13_T$. As a result, in the semiconductor device 2, the length (the channel length) in the Z-direction of the portion of the p-type base layer 13 contacting the second isolating portion 55b changes and is dependent on the etch-back amount of the conductive film 120.

For example, the etch-back rate of the conductive film 120 changes and is dependent on the crystal grain size of the polysilicon. In other words, the etching rate changes because the exposed plane orientation is different between crystal grain sizes. Also, if the crystal grain sizes are different, the impurity concentration in the crystal grains is different, which causes different etching rates. Accordingly, the position of the upper surface of the gate electrode 80 is not always constant between the gate trenches GT.

When a deep recess is formed along the isolating portion 55b as shown in FIG. 17B, the lower end of the n-type source layer 15 is formed at a deeper position. For example, a channel length $L_{C1}$ shown in FIG. 17B is longer than a channel length $L_{C2}$. Thus, when the change of the channel length is large, there are cases where the current concentrates at portions where the channel length is short and the channel resistance is low, and device breakdown occurs.

In the semiconductor device 2, there are cases where the void $V_S$ is formed in the gate electrode 80. Also, there is a risk that fluctuation of the channel resistance caused by nonuniform etch-back of the conductive film 120 may occur. Such structural defects reduce the reliability of the semiconductor device 2.

Conversely, the gate electrode 40 of the semiconductor device 1 is formed by etching the thin conductive film 110 (referring to FIG. 10B and FIG. 11A). Therefore, the fluctuation of the patterning of the gate electrode 40 can be suppressed; and the positional precision of the lower end of the n-type source layer 15 can be increased. Accordingly, in the semiconductor device 1, the fluctuation of the channel length Lc can be suppressed; and the characteristics of the channel length Lc can be improved.

Figure 18:
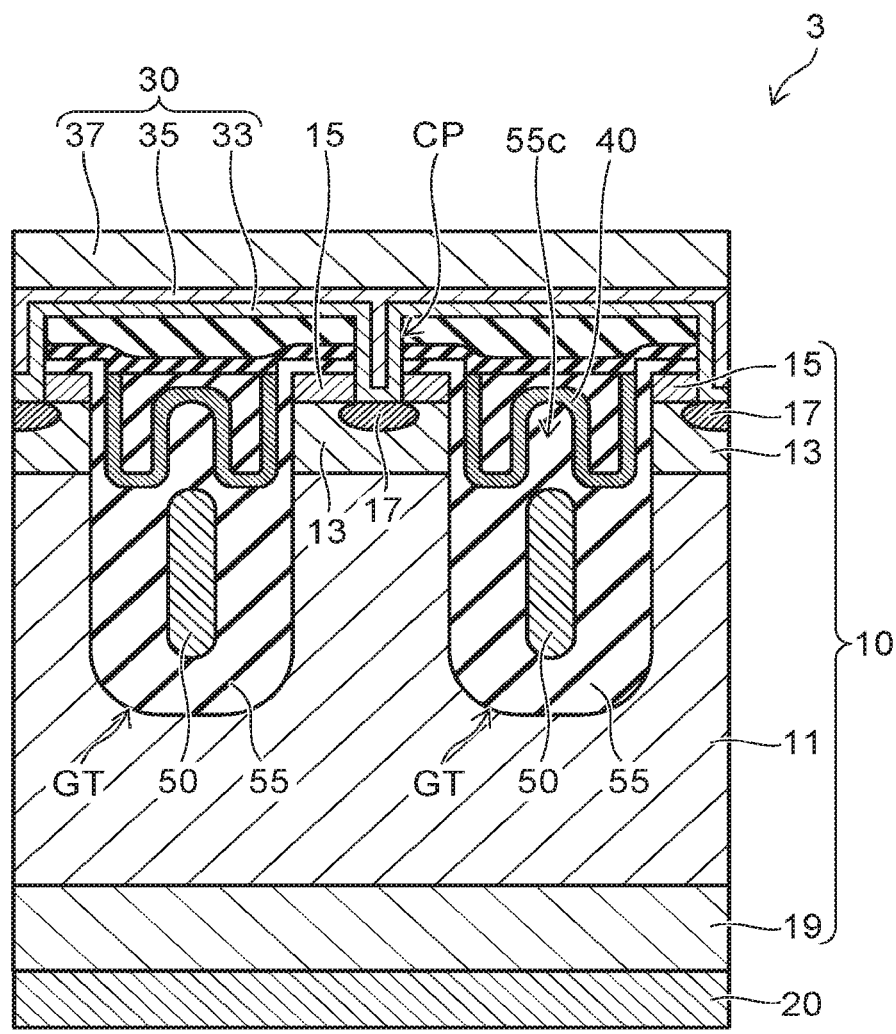
FIG. 18 is a schematic cross-sectional view showing a semiconductor device according to a modification of the embodiment.

FIG. 18 is a schematic cross-sectional view showing a semiconductor device 3 according to a modification of the embodiment. In the trench gate structure of the semiconductor device 3, the field plate electrode 50 does not include the extension portion 50b extending into the third isolating portion 55c. Therefore, in the semiconductor device 3, the gate-source parasitic capacitance can be reduced.

In the manufacturing process of the semiconductor device 3, the entire portion of the conductive film 105 extending into the upper portion space of the gate trench GT (referring to FIG. 8B) is oxidized when performing thermal oxidation of the extending portion. The third isolating portion 55c that does not include the extension portion 50b can be formed thereby.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor part;
   a first electrode provided on the semiconductor part;
   a second electrode, the semiconductor part being provided between the first electrode and the second electrode;
   a control electrode provided in a trench between the semiconductor part and the second electrode;
   a field plate electrode provided in the trench, the field plate electrode being positioned between the first electrode and the control electrode;
   a first insulating film electrically isolating the control electrode and the field plate electrode from the semiconductor part; and
   a second insulating film electrically isolating the control electrode from the second electrode,
   the semiconductor part including a first semiconductor layer of a first conductivity type, a second semiconductor layer of a second conductivity type and a third semiconductor layer of the first conductivity type,
   the second semiconductor layer being provided between the first semiconductor layer and the second electrode,
   the third semiconductor layer being selectively provided between the second semiconductor layer and the second electrode,
   the second semiconductor layer and the third semiconductor layer being electrically connected to the second electrode,
   the trench having a depth capable of extending into the first semiconductor layer from a surface of the semiconductor part,
   the control electrode being positioned, in a depth direction of the trench, at a level same as a level of the second semiconductor layer,
   the field plate electrode being positioned in the first semiconductor layer,
   the first insulating film including first to third isolating portions, the first isolating portion being provided between the first semiconductor layer and the field plate electrode, the second isolating portion being provided between the second semiconductor layer and the control electrode, the third isolating portion being provided between the field plate electrode and the control electrode, the third isolating portion extending into the control electrode,
   the second insulating film including fourth and fifth isolating portions, the fourth isolating portion extending into the control electrode and being positioned between the second and third isolating portions, the fifth isolating portion being positioned between the third isolating portion and the second electrode,
   the control electrode being provided to have a continuous body between the first and second insulating films, the control electrode including first to third portions, the first portion being positioned between the second isolating portion and the fourth isolating portion, the second portion being positioned between the third isolating portion and the fourth isolating portion, the third portion being positioned between the third isolating portion and the fifth isolating portion.

2. The device according to claim 1, wherein
   the trench extends in a direction along a surface of the semiconductor part, and
   the control electrode has a W-shaped cross section, the W-shaped cross section being in a cross section crossing an extension direction of the trench and being along a direction from the first electrode toward the second electrode.

3. The device according to claim 1, further comprising a control interconnect provided on the semiconductor part, the control interconnect being electrically insulated from the semiconductor part by a third insulating film and including a first contact part electrically connected to the third portion of the control electrode,
   the second electrode and the control interconnect being provided on the surface of the semiconductor part,
   the third insulating film being positioned between the control interconnect and the second insulating film.

4. The device according to claim 3, wherein the first contact part of the control interconnect also is connected to the first portion of the control electrode.

5. The device according to claim 1, wherein the second electrode includes a second contact part electrically connected to the field plate electrode.

6. The device according to claim 1, wherein the field plate electrode further includes a portion extending into the third isolating portion of the first insulating film.

7. The device according to claim 1, wherein the field plate electrode is entirely positioned at a level lower than a bottom of the control electrode in the depth direction of the trench.

8. The device according to claim 1, wherein the first portion of the control electrode includes an end portion positioned at a level higher than a level of the third portion in the depth direction of the trench.

9. The device according to claim 1, wherein
   the second insulating film further includes an other fourth isolating portion, and
   the third isolating portion is positioned between the fourth isolating portion and the other fourth isolating portion.

10. The device according to claim 9, wherein the field plate electrode includes a portion positioned between the fourth isolating portion and the other fourth isolating portion.

11. The device according to claim 1, wherein the fourth isolating portion and the fifth isolating portion of the second insulating film include BPSG.

12. The device according to claim 1, wherein the second insulating film further includes an insulating layer covering an end portion of the control electrode and being provided on the fourth isolating portion and the fifth isolating portion.

* * * * *